United States Patent
Murakami et al.

(10) Patent No.: US 9,823,362 B2
(45) Date of Patent: Nov. 21, 2017

(54) RADIATION DETECTOR UBM ELECTRODE STRUCTURE BODY, RADIATION DETECTOR, AND METHOD OF MANUFACTURING SAME

(71) Applicant: JX NIPPON MINING & METALS CORPORATION, Tokyo (JP)

(72) Inventors: Masaomi Murakami, Ibaraki (JP); Makoto Mikami, Ibaraki (JP); Kouji Murakami, Ibaraki (JP); Akira Noda, Ibaraki (JP); Toru Imori, Ibaraki (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 0 days.

(21) Appl. No.: 15/391,207

(22) Filed: Dec. 27, 2016

(65) Prior Publication Data

US 2017/0108594 A1    Apr. 20, 2017

Related U.S. Application Data

(63) Continuation of application No. PCT/JP2015/066781, filed on Jun. 10, 2015.

(30) Foreign Application Priority Data

Jul. 3, 2014  (JP) .................................. 2014-137641
May 14, 2015 (JP) .................................. 2015-099278

(51) Int. Cl.
*G01T 1/24* (2006.01)
*H01L 23/00* (2006.01)
(Continued)

(52) U.S. Cl.
CPC ................ *G01T 1/24* (2013.01); *H01L 24/05* (2013.01); *H01L 24/06* (2013.01); *H01L 24/09* (2013.01);
(Continued)

(58) Field of Classification Search
CPC . G01T 1/24; H01L 31/022408; H01L 31/115; H01L 31/02005; H01L 31/02966;
(Continued)

(56) References Cited

U.S. PATENT DOCUMENTS

2003/0127701 A1* 7/2003 Tiziani .............. H01L 23/53238
257/459
2008/0258066 A1* 10/2008 Chen .................... H01L 31/0203
250/370.01

(Continued)

FOREIGN PATENT DOCUMENTS

JP    S64-084176 A    3/1989
JP    H03-201487 A    9/1991
(Continued)

OTHER PUBLICATIONS

International Search Report for PCT/JP2015/066781, dated Aug. 25, 2015.
(Continued)

*Primary Examiner* — Tom Thomas
*Assistant Examiner* — Nilufa Rahim
(74) *Attorney, Agent, or Firm* — Typha IP LLC

(57) ABSTRACT

The present invention provides a radiation detector UBM electrode structure body and a radiation detector which suppress the degradation of metal electrode layers at the time of formation of UBM layers and achieve sufficient electric characteristics, and a method of manufacturing the same. A radiation detector UBM electrode structure body according to the present invention includes a substrate made of CdTe or CdZnTe, comprising a Pt or Au electrode layer formed on the substrate by electroless plating, an Ni layer formed on the Pt or Au electrode layer by sputtering, and an Au layer formed on the Ni layer by sputtering.

6 Claims, 17 Drawing Sheets

(51) Int. Cl.
*H01L 27/144* (2006.01)
*H01L 27/146* (2006.01)
*H01L 31/08* (2006.01)
*H01L 31/02* (2006.01)
*H01L 31/0224* (2006.01)
*H01L 31/115* (2006.01)
*H01L 31/0296* (2006.01)

(52) U.S. Cl.
CPC .......... *H01L 27/144* (2013.01); *H01L 27/146* (2013.01); *H01L 31/02005* (2013.01); *H01L 31/022408* (2013.01); *H01L 31/08* (2013.01); *H01L 31/115* (2013.01); *H01L 31/0296* (2013.01); *H01L 31/02966* (2013.01); *H01L 2224/0345* (2013.01); *H01L 2224/03464* (2013.01); *H01L 2224/0558* (2013.01); *H01L 2224/05583* (2013.01); *H01L 2224/05584* (2013.01); *H01L 2224/05644* (2013.01); *H01L 2224/05655* (2013.01); *H01L 2224/05664* (2013.01)

(58) Field of Classification Search
CPC ... H01L 31/0296; H01L 27/144; H01L 24/05; H01L 24/09; H01L 24/06; H01L 2224/05644; H01L 2224/05664; H01L 2224/05655; H01L 2224/0345; H01L 2224/03464; H01L 2224/05583; H01L 2224/05584; H01L 2224/0558
See application file for complete search history.

(56) References Cited

U.S. PATENT DOCUMENTS

2010/0193694 A1  8/2010  Chen et al.
2013/0113094 A1*  5/2013  Wu ..................... H01L 23/3171
                                                    257/737
2014/0335654 A1*  11/2014  Barth .................... H01L 21/568
                                                    438/107
2015/0279815 A1*  10/2015  Do ...................... H01L 25/0655
                                                    257/737

FOREIGN PATENT DOCUMENTS

| JP | H03-248578 | A | 11/1991 |
| JP | H07-038132 | A | 2/1995 |
| JP | H08-125203 | A | 5/1996 |
| JP | 2001-177141 | A | 6/2001 |
| JP | 2003-142673 | A | 5/2003 |
| JP | 2004-263242 | A | 9/2004 |
| JP | 2006-521705 | A | 9/2006 |
| JP | 2009-527922 | A | 7/2009 |
| JP | 2010-532429 | A | 10/2010 |
| JP | 2012-516997 | A | 7/2012 |
| WO | 2004/088746 | A1 | 10/2004 |
| WO | 2007/100538 | A1 | 9/2007 |
| WO | 2009/006010 | A1 | 1/2009 |

OTHER PUBLICATIONS

Written Opinion of the International Search Authority for PCT/JP2015/066781, dated Aug. 25, 2015.
International Preliminary Report for PCT/JP2015/066781, dated Jun. 3, 2016.
Taiwanese Office Action for TW 104119277, dated Oct. 4, 2016, which is a corresponding application to this application. With partial English Translation.
S. Vahanen et al., Low-cost bump bonding activities at CERN, Topical Workshop on Electronics for Particle Physics 2010, Nov. 19, 2010, pp. 1-7, IOP Publishing Ltd and SISSA, Bristol, United Kingdom. Cited in Non-Patent Literature Documents No. 4.
Translation of International Preliminary Report for PCT/JP2015/066781, dated Jun. 3, 2016, which was already filed on Dec. 27, 2016.

* cited by examiner

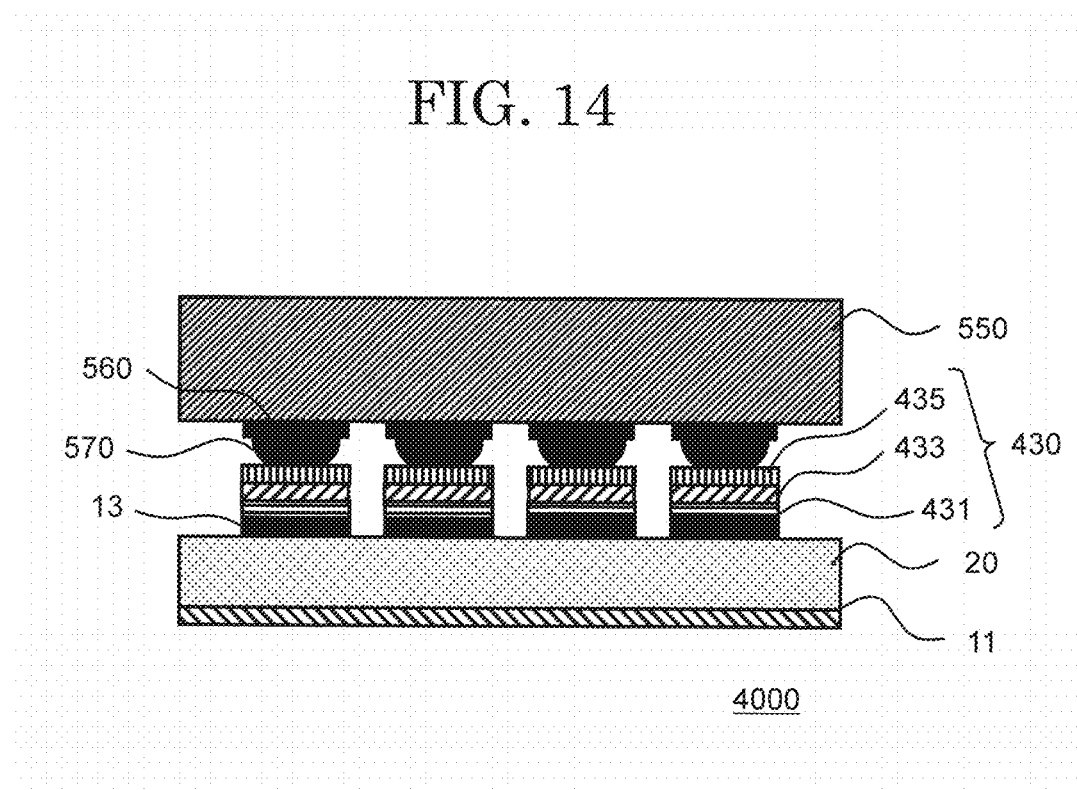

RADIATION DETECTOR UBM ELECTRODE STRUCTURE BODY, RADIATION DETECTOR, AND METHOD OF MANUFACTURING SAME

CROSS REFERENCE TO RELATED APPLICATIONS

This application is based upon and claims the benefit of priority from the prior Japanese Patent Application No. 2014-137641, filed on Jul. 3, 2014, and the prior Japanese Patent Application No. 2015-099278, filed on May 14, 2015, and PCT Application No. PCT/JP2015/066781, filed on Jun. 10, 2015, the entire contents of which are incorporated herein by reference.

FIELD

The present invention relates to a radiation detector UBM electrode structure body and a method of manufacturing the same. The present invention, in particular, relates to a CdTe-based radiation detector UBM electrode structure body and, more particularly, to a radiation detector UBM electrode structure body including a substrate made of CdTe or CdZnTe and a method of manufacturing the same.

BACKGROUND

Cadmium telluride (CdTe) and cadmium zinc telluride (CdZnTe) as II-VI compound semiconductors are higher in radiation detection sensitivity and less susceptible to thermal noise than silicon (Si) and germanium (Ge), and hence are used for radiation detectors which operate at room temperature without separately requiring any cooling mechanisms. A radiation detector is formed by connecting, to a detection circuit, a radiation detection element having metal electrodes formed on the two surfaces of a substrate formed from a single crystal of CdTe or CdZnTe. The radiation detector converts the quantity of electrons emitted from the radiation detection element upon reception of radiation into a current and amplifies it by using the detection circuit, thereby detecting the radiation.

Vacuum deposition, plating, and the like are known as conventional methods of forming metal electrodes to be connected to circuits on the surfaces of CdTe substrates and CdZnTe substrates. Recently, electroless plating has been frequently used, which forms gold electrodes by immersing a CdZnTe substrate in a plating solution containing a gold compound such as chloroauric acid and depositing gold alone or a gold alloy at predetermined portions on the substrate surfaces (see Japanese Patent Application Laid-Open No. 2003-142673, Japanese Patent Application Laid-Open No. 2001-177141, Japanese Patent Application Laid-Open No. H08-125203, Japanese Patent Application Laid-Open No. H07-038132, Japanese Patent Application Laid-Open No. H03-248578 and Japanese Patent Application Laid-Open No. H03-201487).

SUMMARY

When a radiation detector is to be used for imaging, pixel electrodes obtained by one-dimensionally or two-dimensionally arraying fine metal electrodes are formed on the surface of a CdTe substrate or CdZnTe substrate. The resultant structure is combined with a detection array circuit to form a detector module. When performing solder joining between the metal electrodes and the detection array circuit, it is necessary to form UBM (Under Bump Metal) layers to prevent solder from corroding the metal electrodes.

Although UBM layers can be easily formed by electroless plating for metal electrodes and the like disposed on a silicon substrate, for CdTe substrates or CdZnTe substrates, metal electrode layers degrade when UBM layers are formed, thus resulting in failing to obtain sufficient electric characteristics. In addition, when a UBM layer is to be formed by electroless nickel plating, the layer is generally mixed with 4% to 7% phosphorus (P). For this reason, when a solder containing tin (Sn) is mounted on a nickel (Ni) layer, a phosphorus concentration layer is formed in parallel with the formation of a Ni—Sn alloy layer. The phosphorus concentration layer has a high resistance, and hence poses a problem in a device designed to detect a weak current like a radiation detector.

The present invention has been made to solve the above problems in the related art, and has as its challenge to provide a radiation detector UBM electrode structure body and a radiation detector which suppress the degradation of metal electrode layers at the time of formation of UBM layers and achieve sufficient electric characteristics, and a method of manufacturing the same.

According to an embodiment of the present invention, there is provided a radiation detector UBM electrode structure body including a substrate made of CdTe or CdZnTe, comprising a Pt or Au electrode layer formed on the substrate by electroless plating, a Ni layer formed on the Pt or Au electrode layer by sputtering, and an Au layer formed on the Ni layer by sputtering.

In the radiation detector UBM electrode structure body, the Pt or Au electrode layer may have a thickness not less than 0.05 μm and not more than 0.10 μm, and the Ni layer may have a thickness not less than 0.2 μm and not more than 0.6 μm.

According to an embodiment of the present invention, there is provided a radiation detector UBM electrode structure body including a substrate made of CdTe or CdZnTe, comprising a Pt or Au electrode layer formed on the substrate by electroless plating, a Ni layer formed on the Pt or Au electrode layer by sputtering, and a Ni layer and an Au layer sequentially formed on the Ni layer by electroless plating.

In the radiation detector UBM electrode structure body, the Ni layer formed by sputtering may have a thickness not less than 0.05 μm and not more than 0.10 μm, and the Ni layer formed by electroless plating may have a thickness not less than 0.2 μm and not more than 1 μm.

According to an embodiment of the present invention, there is provided a radiation detector UBM electrode structure body including a substrate made of CdTe or CdZnTe, comprising a Pt or Au electrode layer formed on the substrate by electroless plating, a Ni layer formed on the Pt or Au electrode layer by sputtering, and a Pd layer and an Au layer sequentially formed on the Ni layer by sputtering.

The radiation detector UBM electrode structure body may further comprise an insulating film arranged on side surfaces of the Pt or Au electrode layer and the UBM layer, part of an upper surface of the UBM layer, and a surface of the substrate on which the Pt or Au electrode layer is arranged.

In addition, according to an embodiment of the present invention, there is provided a radiation detector comprising a radiation detection element including any one of the radiation detector UBM electrode structure bodies described above and a metal electrode layer disposed on the substrate so as to face the Pt or Au electrode layer formed by electroless plating, and a detection circuit connected to the Au layer of the radiation detection element via a bump.

In addition, according to an embodiment of the present invention, there is provided a method of manufacturing a radiation detector UBM electrode structure body, comprising preparing a substrate made of CdTe or CdZnTe, forming a metal electrode on a first surface of the substrate, forming a Pt or Au electrode layer on a second surface of the substrate by electroless plating so as to face the metal electrode, forming a Ni layer on the Pt or Au electrode layer by sputtering, and forming an Au layer on the Ni layer by sputtering.

In the method of manufacturing the radiation detector UBM electrode structure body, the Pt or Au electrode layer may be formed to a thickness not less than 0.05 μm and not more than 0.10 μm, and the Ni layer may be formed to a thickness not less than 0.2 μm and not more than 0.6 μm.

According to an embodiment of the present invention, there is provided a method of manufacturing a radiation detector UBM electrode structure body, comprising preparing a substrate made of CdTe or CdZnTe, forming a metal electrode on a first surface of the substrate, forming a Pt or Au electrode layer on a second surface of the substrate by electroless plating so as to face the metal electrode, forming a Ni layer on the Pt or Au electrode layer by sputtering, further forming a Ni layer on the Ni layer by electroless plating, and forming an Au layer, by electroless plating, on the Ni layer formed by electroless plating.

In the method of manufacturing the radiation detector UBM electrode structure body, the Ni layer may be formed to a thickness not less than 0.05 μm and not more than 0.10 μm by sputtering, and the Ni layer may be formed to a thickness not less than 0.2 μm and not more than 1 μm by electroless plating.

In addition, according to an embodiment of the present invention, there is provided a method of manufacturing a radiation detector UBM electrode structure body, comprising preparing a substrate made of CdTe or CdZnTe, forming a metal electrode on a first surface of the substrate, forming a Pt or Au electrode layer on a second surface of the substrate by electroless plating so as to face the metal electrode, forming a Ni layer on the Pt or Au electrode layer by sputtering, further forming a Pd layer on the Ni layer by sputtering, and forming an Au layer on the Pd layer by sputtering.

The method of manufacturing the radiation detector UBM electrode structure body may further comprise forming an insulating film arranged on side surfaces of the Pt or Au electrode layer and the UBM layer, part of an upper surface of the UBM layer, and a surface of the substrate on which the Pt or Au electrode layer is arranged.

In addition, according to an embodiment of the present invention, there is provided a method of manufacturing a radiation detector, comprising forming a radiation detection element by cutting the substrate including any one of the radiation detector UBM electrode structure bodies described above into a predetermined shape, and connecting a detection circuit to the Au layer of the radiation detection element via a bump.

BRIEF DESCRIPTION OF DRAWINGS

FIG. 14 schematically shows a schematic view showing a manufacturing process for the radiation detector 4000 according to an embodiment of the present invention;

REFERENCE SIGNS LIST

Figure 1A:
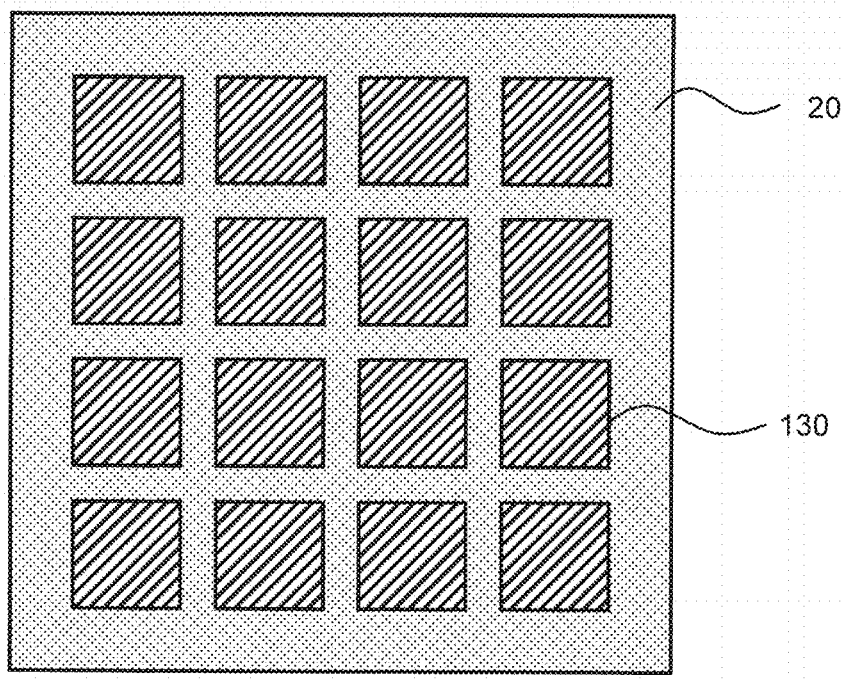
FIG. 1A schematically shows a radiation detector UBM electrode structure body 100 used for a radiation detector according to an embodiment of the present invention, and represents a top view of the radiation detector UBM electrode structure body 100.

11 . . . metal electrode, 13 . . . electrode layer, 20 . . . substrate, 100 . . . radiation detector UBM electrode structure body, 130 . . . UBM layer, 200 . . . radiation detector UBM electrode structure body, 230 . . . UBM layer, 231 . . . Ni layer, 233 . . . Au layer, 300 . . . radiation detector UBM electrode structure body, 330 . . . UBM layer, 331 . . . Ni layer, 333 . . . Ni layer, 335 . . . Au layer, 400 . . . radiation detector UBM electrode structure body, 430 . . . UBM layer, 431 . . . Ni layer, 433 . . . Pd layer, 435 . . . Au layer, 550 . . . integrated circuit substrate, 560 . . . electrode layer, 570 . . . bump, 581 . . . terminal, 583 . . . resistor, 591 . . . condenser, 593 . . . amplifier, 595 . . . multichannel analyzer (MCA), 610 . . . insulating film, 611 . . . PBO layer, 619 . . . peeling of $SiO_2$ film, 1000 . . . radiation detector, 2000 . . . radiation detector, 3000 . . . radiation detector, 4000 . . . radiation detector, 6000 . . . radiation detector

DESCRIPTION OF EMBODIMENTS

A radiation detector UBM electrode structure body, a radiation detector, and a method of manufacturing the same according to the present invention will be described below with reference to the accompanying drawings. The radiation detector UBM electrode structure body, the radiation detector, and the method of manufacturing the same according to the present invention should not be interpreted only by the written contents of the following embodiments and examples. Note that the same reference numerals denote the same portions or portions having similar functions in the drawings to be referred in the embodiments and the examples to be described later, and a repetitive description of them will be omitted.

Figure 1B:
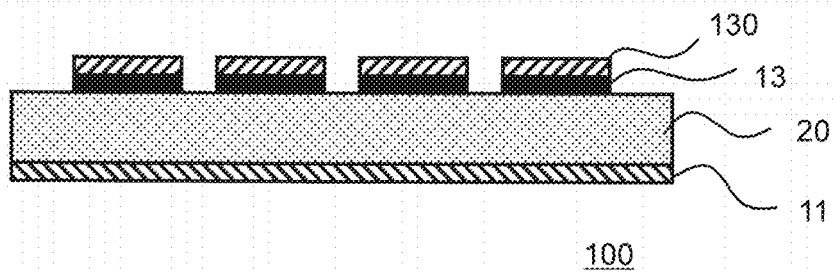
FIG. 1B represents a side view of the radiation detector UBM electrode structure body 100.
Figure 2:
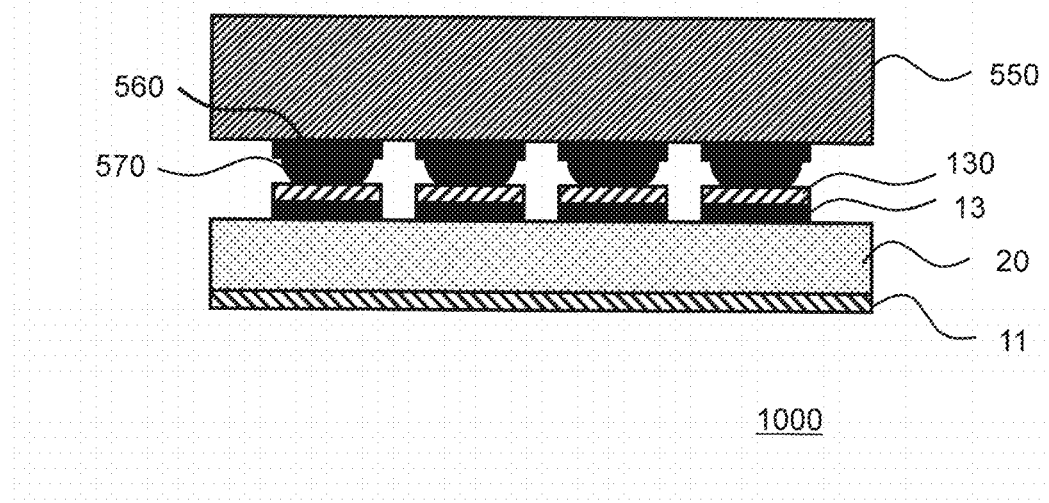
FIG. 2 is a side view of a radiation detector 1000 including the radiation detector UBM electrode structure body 100 according to an embodiment of the present invention.

FIG. 1A and FIG. 1B are schematic views showing a radiation detector UBM electrode structure body 100 constituting a radiation detection element used for a radiation detector according to an embodiment of the present invention. FIG. 1A represents a top view of the radiation detector UBM electrode structure body 100, and FIG. 1B represents a side view of the radiation detector UBM electrode structure body 100. FIG. 2 is a side view of a radiation detector 1000 including the radiation detector UBM electrode structure body 100.

The radiation detector UBM electrode structure body 100 includes a substrate 20, a metal electrode 11 disposed on the first surface of the substrate 20 (the lower surface of the substrate 20 in FIG. 1B), and electrode layers 13 disposed on the second surface of the substrate 20 (the upper surface of the substrate 20 in FIG. 1B) which faces the first surface. The radiation detector UBM electrode structure body 100 also has UBM (Under Bump Metal) layers 130 disposed on the electrode layers 13. The metal electrode 11 is formed on, for example, the entire first surface of the substrate 20. In addition, the electrode layers 13 are disposed on, for example, the second surface of the substrate 20 in a matrix pattern. The radiation detector 1000 also includes an integrated circuit substrate 550 on which electrode layers 560 are disposed.

In the present invention, the UBM (Under Bump Metal) layers 130 are disposed on the surfaces of the electrode layers 13 which are connected to bumps 570 to prevent the solder of the bumps 570 from corroding the electrode layers 13. Each UBM layer 130 according to the present invention features unprecedented low resistance. The electrode layers 13 of the radiation detector UBM electrode structure body 100 are connected to the corresponding electrode layers 560, disposed on the integrated circuit substrate 550, via the UBM layers 130 and the bumps 570.

The substrate 20 is a substrate made of CdTe or CdZnTe. The substrate 20 is formed into a thin plate. For example, the principal surface of the substrate 20 on which the metal electrode 11 and the electrode layers 13 are formed is the (111) plane. Since the crystal orientation [111] is the polar axis of CdZnTe, the ratio of Cd of the composition of the second surface of the surfaces of the substrate 20 is high, and the ratio of Te of the composition of the first surface is high.

The metal electrode 11 and the electrode layers 560 are formed from thin films made of noble metals such as gold, platinum, and indium. On the other hand, the electrode layers 13 are platinum (Pt) or gold (Au) electrode layers formed on the substrate 20 by electroless plating. In this embodiment, the metal electrode 11 is a common electrode. The electrode layers 13 are pixel electrodes. In addition, the electrode layers 560 correspond to the electrode layers 13 and receive currents from the electrode layers 13 via the bumps 570.

Figure 3:
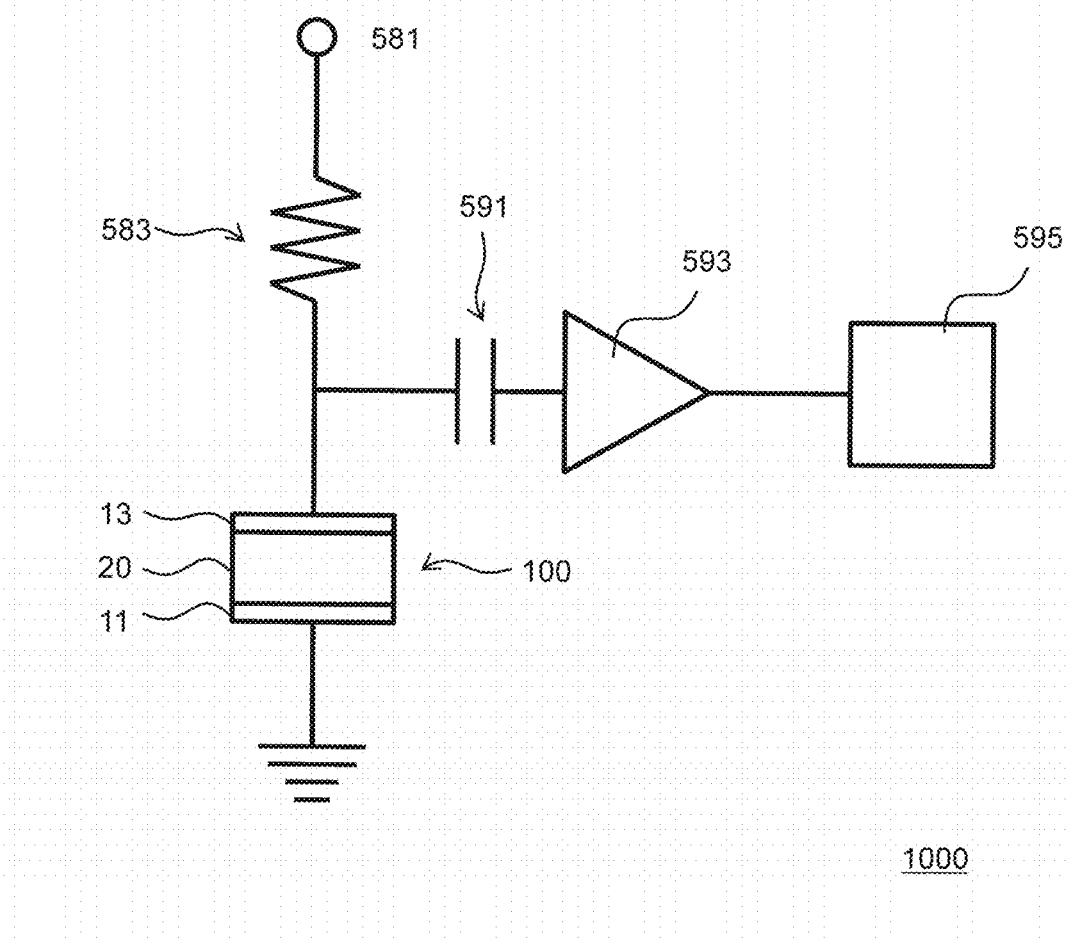
FIG. 3 is a circuit diagram of the radiation detector 1000 according to an embodiment of the present invention.

FIG. 3 is a circuit diagram of the radiation detector 1000 according to an embodiment of the present invention. In an embodiment, the radiation detector 1000 includes a radiation detection element formed from the radiation detector UBM electrode structure body 100, and a detection circuit formed from a condenser 591 and an amplifier 593 and a multichannel analyzer (MCA) 595 and the like. In the radiation detector UBM electrode structure body 100, the metal electrode 11 (common electrode) is connected to the ground (grounded), and each electrode layer 13 (pixel electrode 8) is connected to a negative potential terminal 581 via a resistor 583 of the detection circuit, thereby allowing the application of a predetermined bias voltage. In addition, the electrode layer 13 is connected to the MCA 595 via the condenser 591 and the amplifier 593.

The integrated circuit substrate 550 includes at least some of detection circuits such as the condenser 591 and the amplifier 593. When the substrate 20 emits electrons upon reception of radiation (hard X-rays or γ-rays), the electrons are converted into an ionization current due to a bias voltage. This current flows from the radiation detector UBM electrode structure body 100 to the integrated circuit substrate 550 via the electrode layer 13, the bump 570, and the electrode layer 13. The current is converted into a pulse signal via the condenser 591 and the amplifier 593. The pulse signal is analyzed by a multichannel analyzer to obtain a radiation spectrum.

In the present invention, the UBM (Under Bump Metal) layers 130 are disposed on the surfaces of the electrode layers 13 which are connected to the bumps 570. As described above, when UBM layers are formed by a conventional electroless nickel plating technique, high-resistance phosphorus concentration layers are also formed. Eager studies on methods of forming low-resistance UBM layers while suppressing the formation of such phosphorus concentration layers have found that such UBM layers can be obtained by forming UBM layers using a combination of sputtering and electroless plating, which is not generally adopted because it requires a complex working process, thus completing the invention. Although this specification will describe four methods below, the present invention is not limited to them.

First Embodiment

Figure 4:
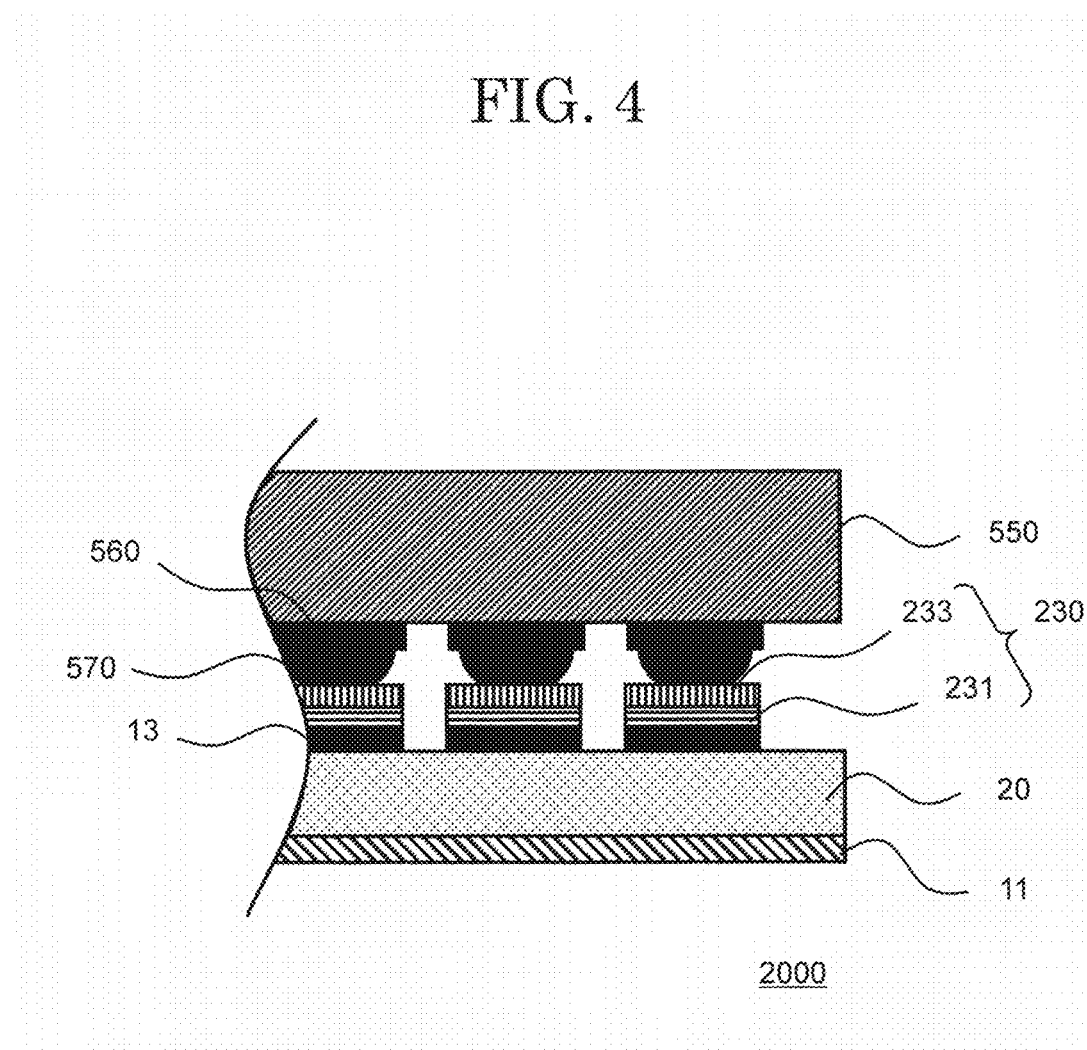
FIG. 4 is a schematic view showing a radiation detector 2000 according to an embodiment of the present invention.

FIG. 4 is a schematic view showing a radiation detector 2000 according to an embodiment of the present invention. FIG. 4 is an enlarged view of a portion in FIG. 2. The radiation detector 2000 has bumps 570 connected to electrode layers 13 via UBM layers 230. Each UBM layer 230 according to this embodiment includes a Ni layer 231 formed on the Pt or Au electrode layer 13 by sputtering and an Au layer 233 formed on the Ni layer 231 by sputtering.

In this embodiment, the thickness of each electrode layer 13 is preferably 0.05 μm or more and 0.10 μm or less. If the thickness of the electrode layer 13 is smaller than 0.05 μm, the electrode layer 13 is low in durability and partially lost due to slight impact. As a result, CdZnTe is exposed to the outside. If the thickness of the electrode layer 13 is larger than 0.10 μm, the electrode layer 13 is low in adhesion with CdZnTe and hence undesirably easily peels off. In addition, the thickness of the Ni layer 231 is preferably 0.2 μm or more and 0.6 μm or less. If the thickness of the Ni layer 231 is smaller than 0.2 μm, the Ni layer 231 is low in durability and partially lost due to slight impact. If the thickness of the Ni layer 231 is larger than 0.6 μm, the Ni layer 231 is low in adhesion with the electrode layer 13 and hence undesirably easily peels off.

(Method of Manufacturing Radiation Detector)

A method of manufacturing the radiation detector 2000 according to this embodiment will be described. The method of manufacturing the radiation detector 2000 includes, for example, a substrate manufacturing process, an electrode forming process, a dicing process, and an integrated circuit substrate connecting process. However, this method is not limited to these processes. FIG. 5A to FIG. 5D schematically show manufacturing processes for the radiation detector 2000 according to an embodiment of the present invention.

A substrate manufacturing process (FIG. 5A) is a process of preparing a substrate made of CdTe or CdZnTe. In this process, a thin disk-like substrate (wafer) is prepared by cutting a CdTe or CdZnTe single crystal ingot along the crystal plane (111) (cutting process). The cut surfaces (the first surface on which the metal electrode 11 is disposed and the second surface on which the electrode layers 13 are disposed) of the prepared substrate are physically mirror-polished by using an abrasive such as alumina powder (polishing process). This polishing process may be repeated more than once for each substrate.

Figure 5A:
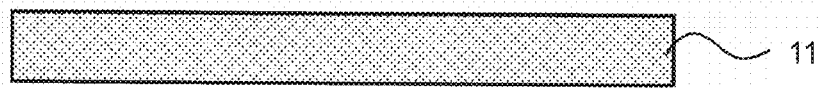
FIG. 5A schematically shows a manufacturing process for the radiation detector 2000 according to an embodiment of the present invention.
Figure 5B:
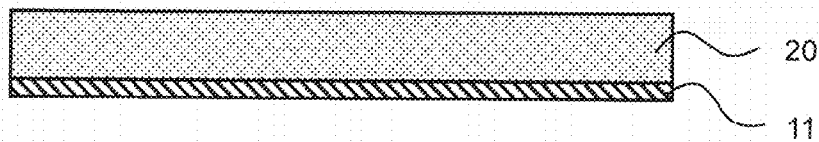
FIG. 5B schematically shows a manufacturing process for the radiation detector 2000 according to an embodiment of the present invention.
Figure 5C:
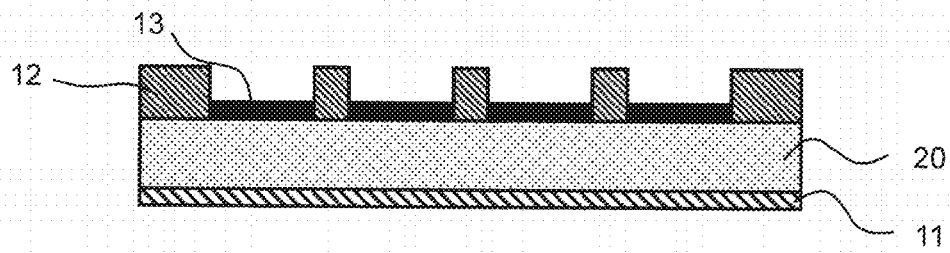
FIG. 5C schematically shows a manufacturing process for the radiation detector 2000 according to an embodiment of the present invention.

In an electrode forming process, a metal electrode 11 is formed on the first surface of a substrate 20 (FIG. 5B), and the electrode layers 13 are formed on the second surface of the substrate 20 so as to face the metal electrode (FIG. 5C). In the electrode forming process, for example, the substrate 20 is immersed in methanol and ultrasonically cleaned at room temperature to remove foreign substances adhering to the substrate 20. The surface of the substrate 20 is coated with a photoresist. The photoresist is exposed using a photomask on which a pixel electrode pattern is drawn. The exposed photoresist is then removed by developing. Thereafter, the substrate 20 is immersed in an etchant prepared by mixing hydrogen bromide, bromine, and water to etch the polished surface of the substrate 20 at room temperature, thereby removing the affected layer from the surface of the substrate 20. The etchant is removed from the substrate 20 by using methanol, which in turn is removed from the substrate by using pure water, thereby forming the electrode patterns 13.

Subsequently, for example, the substrate 20 is immersed in a plating solution prepared by mixing hexachloroplatinic (IV) acid hexahydrate solution and hydrochloric acid to deposit a noble metal, e.g., platinum (Pt), on the portions of the polished surface of the substrate 20 from which the photoresist has been removed, thereby forming the electrode layers 13 each having a thickness of 0.05 μm or more and 0.10 μm or less (electroless plating process). Note that the electrode layers 13 made of gold (Au) can be formed by a similar electroless plating process.

Figure 5D:
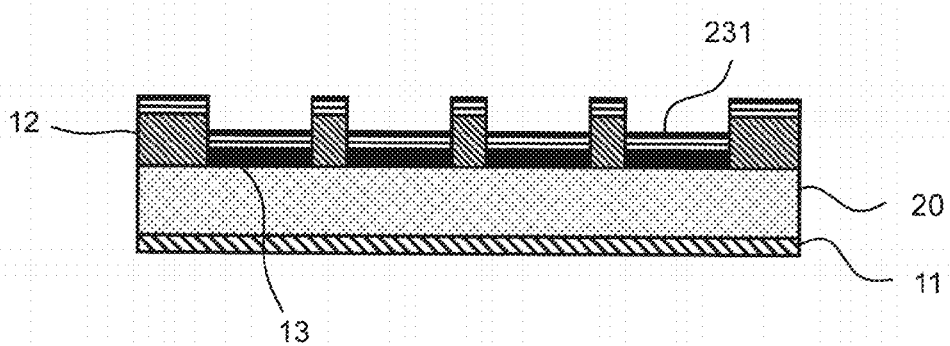
FIG. 5D schematically shows a manufacturing process for the radiation detector 2000 according to an embodiment of the present invention.
Figure 6A:
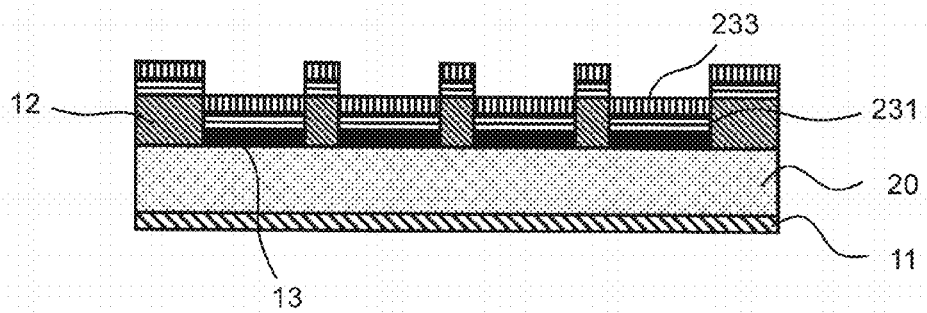
FIG. 6A schematically shows a manufacturing process for the radiation detector 2000 according to an embodiment of the present invention.

The substrate 20 on which the metal electrode 11 and the electrode layers 13 are formed is mounted on a sputtering apparatus. In an Ar gas atmosphere, plasma is generated to sputter a Ni target to form the Ni layer 231 having a thickness of 0.2 μm or more and 0.6 μm or less on the substrate 20 (FIG. 5D). The target is then changed to an Au target to form the Au layer 233 on the Ni layer 231 (FIG. 6A).

Figure 6B:
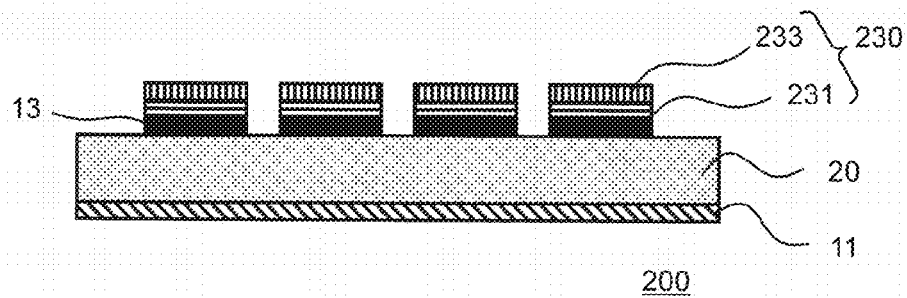
FIG. 6B schematically shows a manufacturing process for the radiation detector 2000 according to an embodiment of the present invention.

The Ni layer 231 and the Au layer 233 are also formed on resist remaining portions 12. The substrate 20 is immersed in a solvent such as acetone and ultrasonically cleaned to peel off the remaining resist 12 and lift off the Ni layer 231 and the Au layer 233 on the resist 12. The substrate 20 is cleaned with pure water. The substrate 20 then dried by, for example, spraying nitrogen gas against the substrate 20, thus obtaining a radiation detector UBM electrode structure body 200 in which each electrode layer 13 is provided with the UBM layer 230 having the Au layer 233 formed on the Ni layer 231 (FIG. 6B).

Figure 6C:
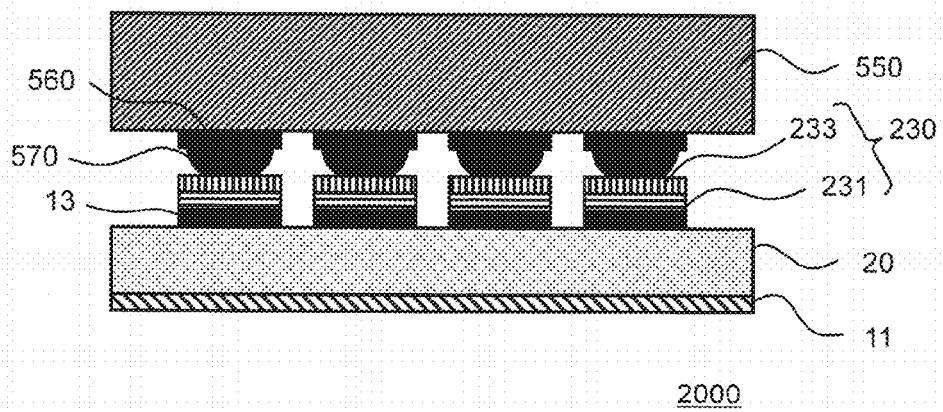
FIG. 6C schematically shows a manufacturing process for the radiation detector 2000 according to an embodiment of the present invention.

Subsequently, the radiation detector UBM electrode structure body 200 is diced as needed. This forms a radiation detection element cut into a predetermined shape. Note that a known method can be used for dicing, and hence a detailed description of it will be omitted. The electrode layers 13 on which the UBM layers 230 of the radiation detector UBM electrode structure body 200 constituting a radiation detection element are disposed are connected to electrode layers 560 of an integrated circuit substrate 550 constituting a detection circuit via the bumps 570 (FIG. 6C). This makes it possible to manufacture the radiation detector 2000 according to this embodiment.

As described above, the radiation detector according to this embodiment can obtain sufficient adhesive strength by combining electrode layer formation by electroless plating and UBM layer formation by sputtering. This is because, it is possible to suppress the degradation of electrode layers at the time of formation of UBM layers by deposition using sputtering and obtain usable adhesion while maintaining bump solder barrier properties by setting the Ni layer thickness to 0.2 µm or more and 0.6 µm or less. In addition, the Ni layer of each UBM layer is formed by sputtering, and hence can be formed as a Ni layer having high purity. Since it is possible to suppress mixing of phosphorus which tends to be mixed from a plating solution into a Ni layer in a plating process or the like, it is possible to suppress the formation of a phosphorus-mixed (P-rich) layer due to the thermal diffusion of phosphorus on the surface of the Ni layer at the time of formation of each UBM layer and to avoid an increase in resistance due to P-rich layers. This makes it possible to implement a radiation detector UBM electrode structure body and a radiation detector which achieve sufficient electric characteristics.

Second Embodiment

Figure 7:
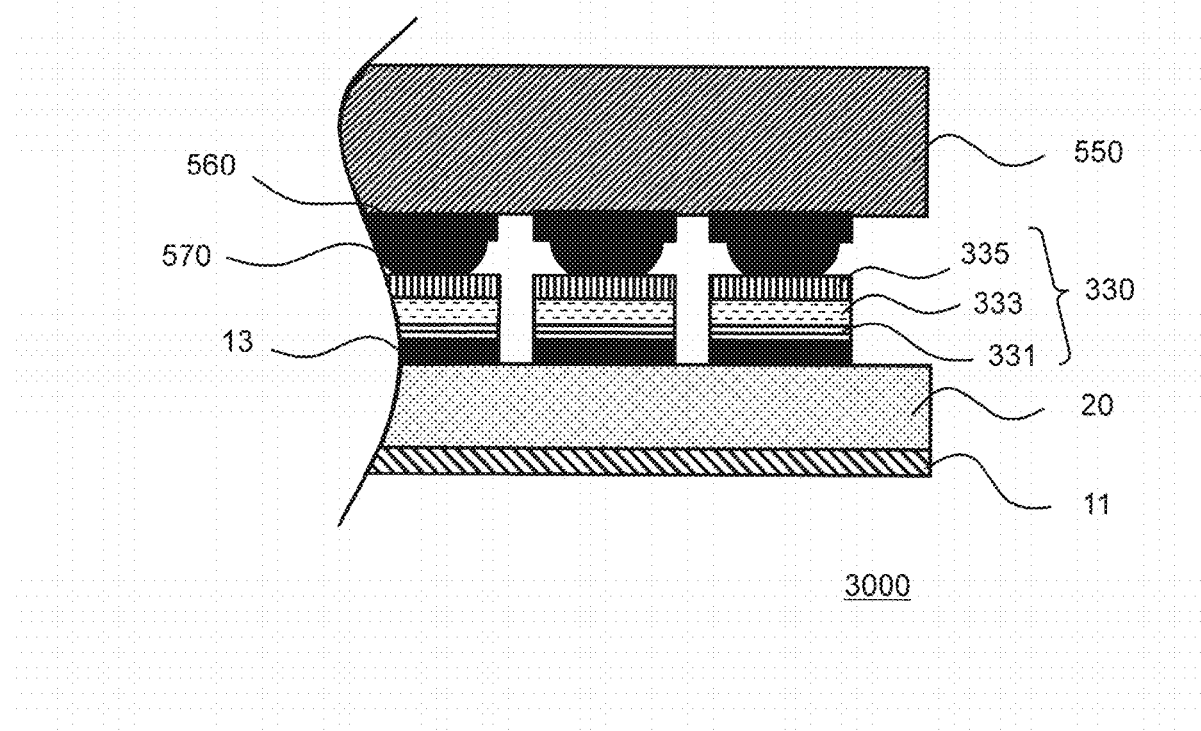
FIG. 7 is a schematic view showing a radiation detector 3000 according to an embodiment of the present invention.

The first embodiment has exemplified the case in which UBM layers are formed by sputtering. The second embodiment will exemplify a case in which UBM layers are formed by a combination of sputtering and electroless plating. FIG. 7 is a schematic view showing a radiation detector 3000 according to an embodiment of the present invention. FIG. 7 is an enlarged view of a portion in FIG. 2. The radiation detector 3000 has bumps 570 connected to electrode layers 13 via UBM layers 330. Each UBM layer 330 according to this embodiment includes a Ni layer 331 formed on the Pt or Au electrode layer 13 by sputtering, and a Ni layer 333 and an Au layer 335 which are sequentially formed on the Ni layer 331 by electroless plating.

In this embodiment, the thickness of each Ni layer 331 is preferably 0.05 µm or more and 0.10 µm or less. If the thickness of the Ni layer 331 is smaller than 0.05 µm, the electrode layer 13 is undesirably corroded in a subsequent electroless Ni plating process. In addition, the Ni layer is low in durability and undesirably partially lost due to slight impact. Although no serious problem arises when the Ni layer 331 is deposited to a thickness larger than 0.10 µm by sputtering, 0.10 µm or less is sufficient for the thickness of the layer in consideration of the corrosion resistance and manufacturing cost of the electrode layer 13. In addition, the thickness of the Ni layer 333 formed on the Ni layer 331 by electroless plating is preferably 0.2 µm or more and 1µ or less. If the thickness of the Ni layer 333 is smaller than 0.2 µm, the essential function of UBM, i.e., the prevention of diffusion of the bump into the electrode layer 13, becomes insufficient. In contrast, if the thickness of the Ni layer 333 is larger than 1 µm, adhesion with the Ni layer 331 degrades, and the Ni layer 333 undesirably tends to peel off.

It is confirmed in the first embodiment that a low-resistance UBM structure with adhesion can be implemented by forming the Ni layers 231 by sputtering on the Pt or Au electrode layers 13 formed by electroless plating and forming the Au layers 233 on the Ni layers 231 by sputtering. The following is confirmed in the second embodiment. Each ultrathin Ni layer 331 formed by sputtering can be made to function as an anti-corrosion layer for the electrode layer 13 at the time of electroless Ni plating by forming the ultrathin Ni layer 331 on the electrolessly plated electrode layer 13 by sputtering and sequentially forming the Ni layer 333 and the Au layer 335 on the Ni layer 331 by electroless plating. In addition, this can prevent the degradation of electric characteristics due to the corrosion of the electrode layer 13, form an electrolessly Ni-plated layer with adhesion as the Ni layer 333, and make the Au surface layer have good solder wettability.

(Method of Manufacturing Radiation Detector)

A method of manufacturing the radiation detector 3000 according to this embodiment will be described. The method of manufacturing the radiation detector 3000 includes, for example, a substrate manufacturing process, an electrode forming process, a dicing process, and an integrated circuit substrate connecting process. However, this method is not limited to these processes. FIG. 8A to FIG. 8D schematically show manufacturing processes for the radiation detector 3000 according to an embodiment of the present invention.

A substrate manufacturing process (FIG. 8A) is a process of preparing a substrate made of CdTe or CdZnTe. In this process, a thin disk-like substrate (wafer) is prepared by cutting a CdTe or CdZnTe single crystal ingot along the crystal plane (111) (cutting process). The cut surfaces (the first surface on which the metal electrode 11 is disposed and the second surface on which the electrode layers 13 are disposed) of the prepared substrate are physically mirror-polished by using an abrasive such as alumina powder (polishing process). This polishing process may be repeated more than once for each substrate.

Figure 8A:
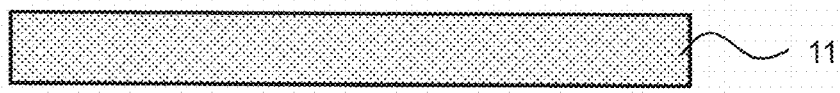
FIG. 8A schematically shows a manufacturing process for the radiation detector 3000 according to an embodiment of the present invention.
Figure 8B:
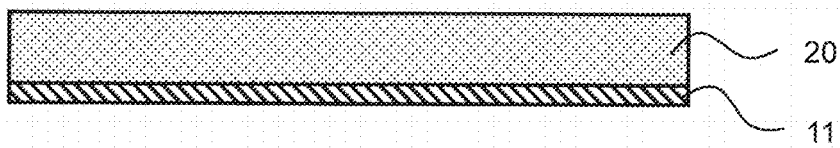
FIG. 8B schematically shows a manufacturing process for the radiation detector 3000 according to an embodiment of the present invention.
Figure 8C:
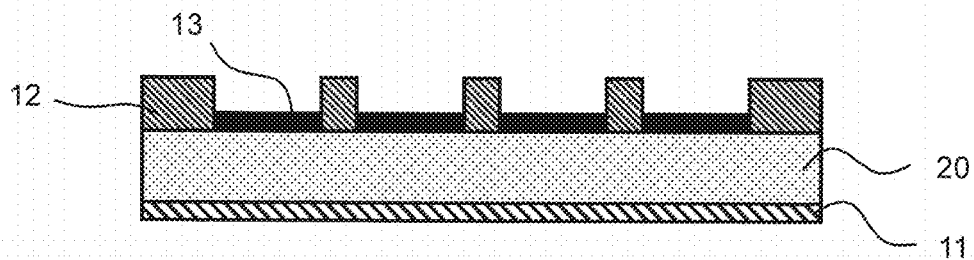
FIG. 8C schematically shows a manufacturing process for the radiation detector 3000 according to an embodiment of the present invention.

In an electrode forming process, a metal electrode 11 is formed on the first surface of a substrate 20 (FIG. 8B), and the electrode layers 13 are formed on the second surface of the substrate 20 so as to face the metal electrode (FIG. 8C). In the electrode forming process, for example, the substrate 20 is immersed in methanol and ultrasonically cleaned at room temperature to remove foreign substances adhering to the substrate 20. The surface of the substrate 20 is coated with a photoresist. The photoresist is exposed using a photomask on which a pixel electrode pattern is drawn. The exposed photoresist is then removed by developing. Thereafter, the substrate 20 is immersed in an etchant prepared by mixing hydrogen bromide, bromine, and water to etch the polished surface of the substrate 20 at room temperature, thereby removing the affected layer from the surface of the substrate 20. The etchant is diluted and removed from the substrate 20 by using methanol, which in turn is cleaned and removed from the substrate by using pure water, thereby forming the electrode patterns 12.

Subsequently, for example, the substrate 20 is immersed in a plating solution prepared by mixing hexachloroplatinic (IV) acid hexahydrate solution and hydrochloric acid to deposit a noble metal, e.g., platinum (Pt), on the portions of the polished surface of the substrate 20 from which the photoresist has been removed, thereby forming the electrode layers 13 each having a thickness of 0.05 µm or more and 0.10 µm or less (electroless plating process). Note that the electrode layers 13 made of gold (Au) can be formed by electroless plating using a plating solution containing Hydrogen Tetrachloroaurate (III) Tetrahydrate and sodium hydroxide.

Figure 8D:
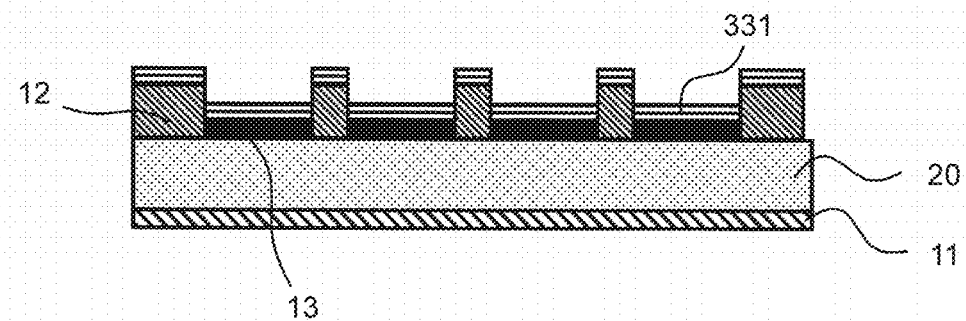
FIG. 8D schematically shows a manufacturing process for the radiation detector 3000 according to an embodiment of the present invention.

The substrate 20 on which the metal electrode 11 and the electrode layers 13 are formed is mounted on a sputtering apparatus. In an Ar gas atmosphere, plasma is generated to sputter a Ni target to form the Ni layer 331 on the substrate 20 (FIG. 8D).

Figure 9A:
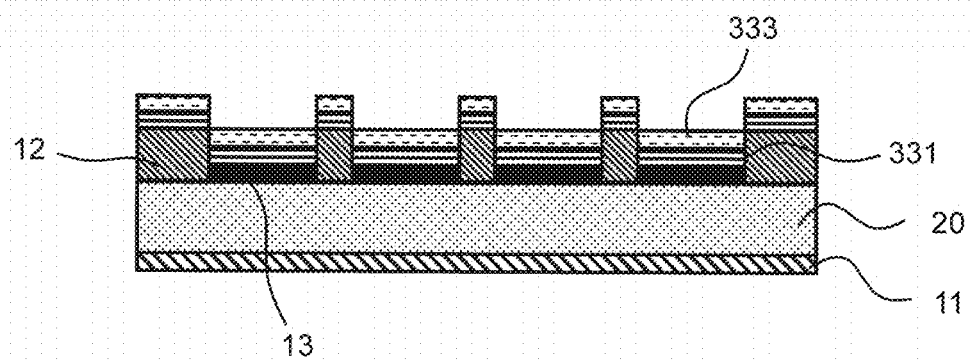
FIG. 9A schematically shows a manufacturing process for the radiation detector 3000 according to an embodiment of the present invention.
Figure 9B:
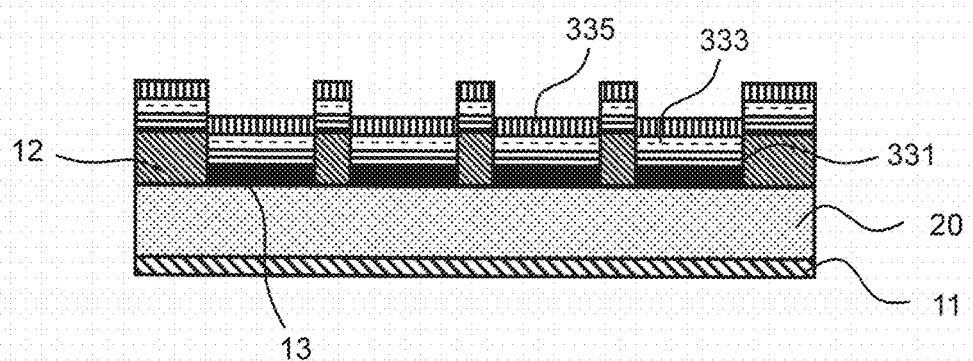
FIG. 9B schematically shows a manufacturing process for the radiation detector 3000 according to an embodiment of the present invention.
Figure 9C:
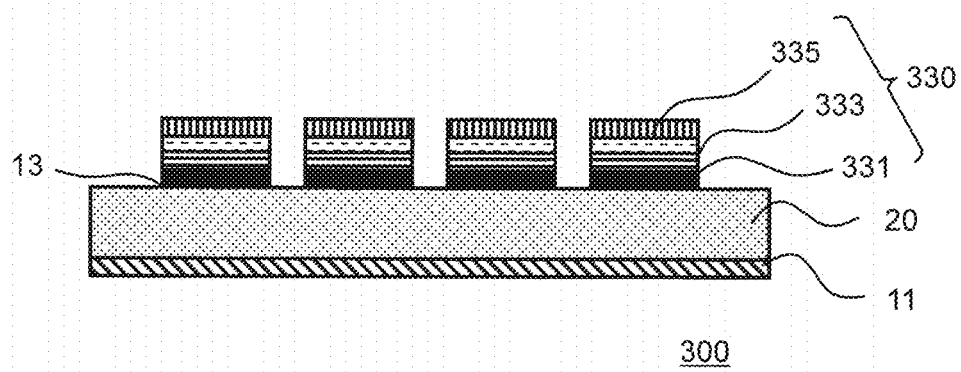
FIG. 9C schematically shows a manufacturing process for the radiation detector 3000 according to an embodiment of the present invention.

In this embodiment, each Ni layer 331 is immersed in an electroless Ni plating solution, and the Ni layer 333 having a thickness of 0.2 µm or more and 1 µm or less is further formed on the Ni layer 331 formed by sputtering (FIG. 9A). The Au layer 335 is formed on the Ni layer 333 by electroless plating (FIG. 9B). The Ni layer 331, the Ni layer 333, and the Au layer 335 are also formed on each resist remaining portion 12. The substrate 20 is immersed in a solvent such as acetone and ultrasonically cleaned to peel off the remaining resist 12 and lift off the Ni layer 331, the Ni layer 333, and the Au layer 335 on the resist 12. The substrate 20 is cleaned with pure water. The substrate 20 then dried by, for example, spraying nitrogen gas against the substrate 20, thus obtaining a radiation detector UBM electrode structure body 300 in which each electrode layer 13 is provided with the UBM layer 330 constituted by the Ni layer 331, the Ni layer 333, and the Au layer 335 (FIG. 9C).

Figure 10:
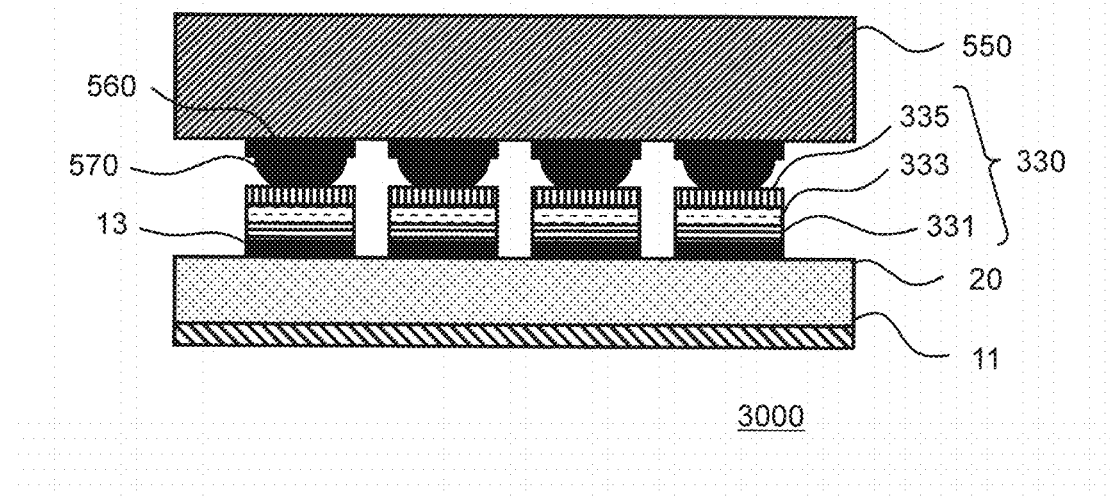
FIG. 10 schematically shows a schematic view showing a manufacturing process for the radiation detector 3000 according to an embodiment of the present invention.

Subsequently, the radiation detector UBM electrode structure body 300 is diced as needed. This forms a radiation detection element cut into a predetermined shape. Note that a known method can be used for dicing, and hence a detailed description of it will be omitted. The electrode layers 13 on which the UBM layers 330 of the radiation detector UBM electrode structure body 300 constituting a radiation detection element are disposed are connected to electrode layers 560 of an integrated circuit substrate 550 constituting a detection circuit via the bumps 570 (FIG. 10). This makes it possible to manufacture the radiation detector 3000 according to this embodiment.

Although the radiation detector according to this embodiment includes the UBM layers which are partially formed by electroless plating, since Ni layers are formed by sputtering on the electrode layers formed by electroless plating, sufficient adhesive strength can be obtained. In addition, although the UBM layers formed by electroless plating exhibit sufficient adhesion, the electrode layers degrade at the time of formation of the UBM layers. In the embodiment, however, the mixing of phosphorus with the electrode layers at the time of electroless plating can be suppressed by forming the thin Ni layers, by sputtering, between the electrode layers and the UBM layers formed by electroless plating. Therefore, this embodiment can implement a radiation detector UBM electrode structure body and a radiation detector which achieve sufficient electric characteristics.

Third Embodiment

Figure 11:
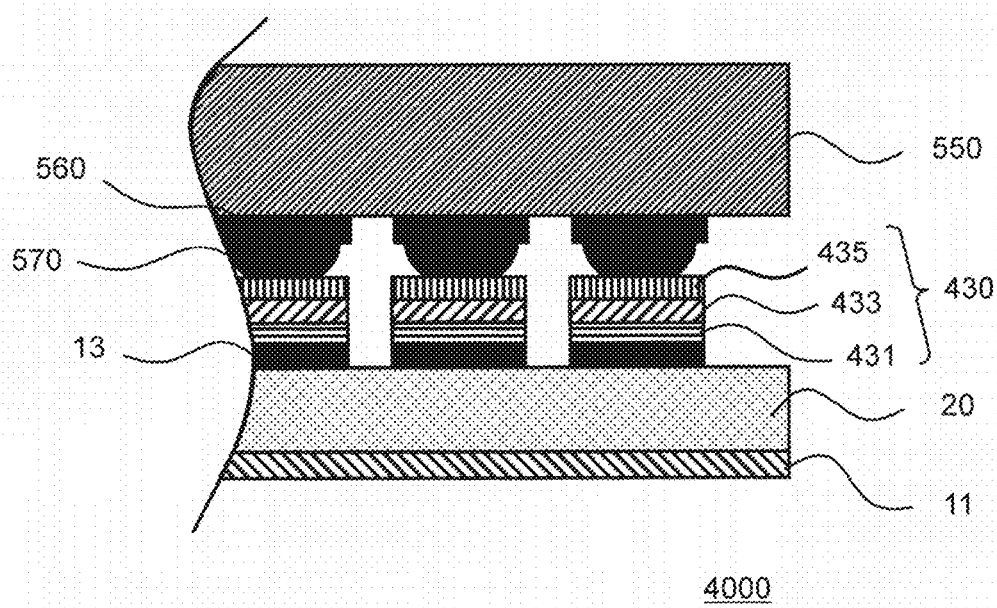
FIG. 11 is a schematic view showing a radiation detector 4000 according to an embodiment of the present invention.

The third embodiment will exemplify a case in which UBM layers are formed, each having a Pd layer arranged between a Ni layer and an Au layer. FIG. 11 is a schematic view showing a radiation detector 4000 according to an embodiment of the present invention. FIG. 11 is an enlarged view of a portion in FIG. 2. The radiation detector 4000 has bumps 570 connected to electrode layers 13 via UBM layers 430. Each UBM layer 430 according to this embodiment includes a Ni layer 431 formed on the Pt or Au electrode layer 13 by sputtering, a Pd layer 433 formed on the Ni layer 431, and an Au layer 435 formed on the Pd layer 433. Note that in the embodiment, the Pd layer 433 can be formed by sputtering or electroless plating.

In this embodiment, the thickness of each Ni layer 431 is preferably 0.2 µm or more and 0.6 µm or less. If the thickness of the Ni layer 431 is smaller than 0.2 µm, corrosion by a solder component at the time of solder joining cannot be prevented. Although no serious problem arises when the Ni layer 431 is deposited to a thickness larger than 0.6 µm by sputtering, 0.6 µm or less is sufficient for the thickness of the layer in consideration of the easiness of peeling with a decrease in adhesion with the electrode layer 13 and the manufacturing cost.

In addition, the thickness of the Pd layer 433 formed on each Ni layer 431 by sputtering is preferably 0.03 µm or more and 0.1 µm or less. In this embodiment, the Pd layer 433 can suppress the thermal diffusion of Ni into the surface of the Au layer 435 and the formation of a nickel oxide on the surface of the Au layer 435 and improve solder wettability. For this reason, the Pd layer 433 having a thickness smaller than 0.03 µm is not sufficient in terms of suppressing and preventing the thermal diffusion of Ni into the surface of the Au layer 435. The Pd layer 433 having a thickness larger than 0.1 µm is undesirably low in adhesion with the Ni layer 431, and tends to peel off.

The following is confirmed in the third embodiment. The thermal diffusion of Ni into the surface of each Au layer 435 and the formation of a nickel oxide on the surface of the Au layer 435 are suppressed by forming the Ni layer 431 on the electrolessly plated electrode layer 13 by sputtering and sequentially forming the Pd layer 433 and the Au layer 435 on the Ni layer 431 by sputtering. This improves solder wettability.

(Method of Manufacturing Radiation Detector)

A method of manufacturing the radiation detector 4000 according to this embodiment will be described. The method of manufacturing the radiation detector 4000 includes, for example, a substrate manufacturing process, an electrode forming process, a dicing process, and an integrated circuit substrate connecting process. However, this method is not limited to these processes. FIG. 12A to FIG. 12D schematically show manufacturing processes for the radiation detector 4000 according to an embodiment of the present invention.

A substrate manufacturing process (FIG. 12A) is a process of preparing a substrate made of CdTe or CdZnTe. In this process, a thin disk-like substrate (wafer) is prepared by cutting a CdTe or CdZnTe single crystal ingot along the crystal plane (111) (cutting process). The cut surfaces (the first surface on which the metal electrode 11 is disposed and the second surface on which the electrode layers 13 are disposed) of the prepared substrate are physically mirror-polished by using an abrasive such as alumina powder (polishing process). This polishing process may be repeated more than once for each substrate.

Figure 12A:
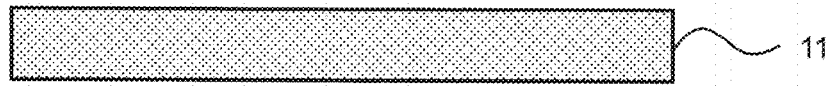
FIG. 12A schematically shows a manufacturing process for the radiation detector 4000 according to an embodiment of the present invention.
Figure 12B:
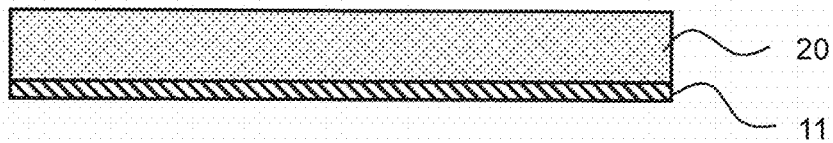
FIG. 12B schematically shows a manufacturing process for the radiation detector 4000 according to an embodiment of the present invention.
Figure 12C:
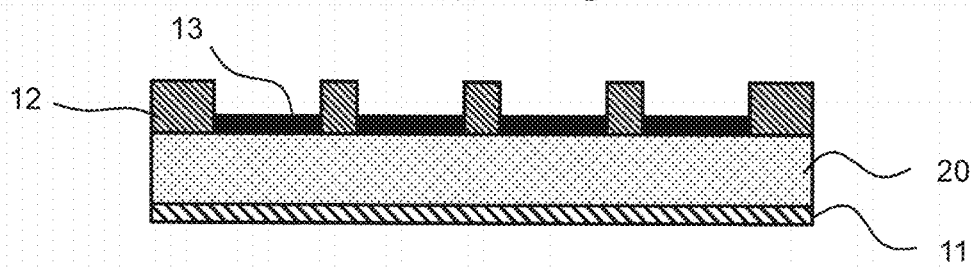
FIG. 12C schematically shows a manufacturing process for the radiation detector 4000 according to an embodiment of the present invention.

In an electrode forming process, a metal electrode 11 is formed on the first surface of a substrate 20 (FIG. 12B), and the electrode layers 13 are formed on the second surface of the substrate 20 so as to face the metal electrode (FIG. 12C). The electrode forming process may be the same process as that in the second embodiment described above, and hence a detailed description of it will be omitted.

Figure 12D:
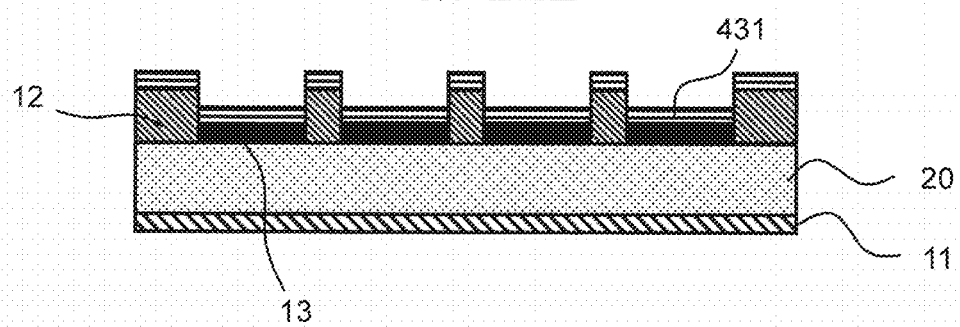
FIG. 12D schematically shows a manufacturing process for the radiation detector 4000 according to an embodiment of the present invention.

The substrate 20 on which the metal electrode 11 and the electrode layers 13 are formed is mounted on a sputtering apparatus. In an Ar gas atmosphere, plasma is generated to sputter a Ni target to form the Ni layers 431 on the substrate 20 (FIG. 12D).

Figure 13A:
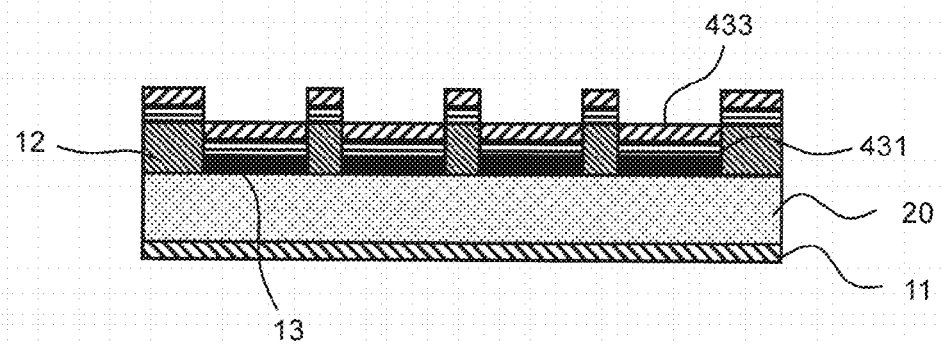
FIG. 13A schematically shows a manufacturing process for the radiation detector 4000 according to an embodiment of the present invention.
Figure 13B:
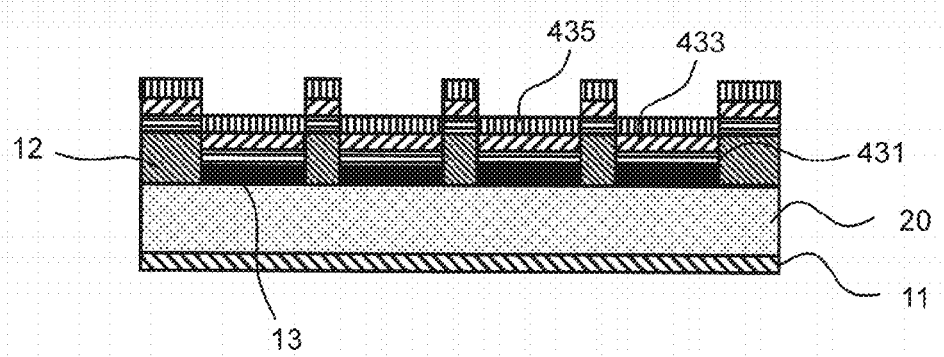
FIG. 13B schematically shows a manufacturing process for the radiation detector 4000 according to an embodiment of the present invention.
Figure 13C:
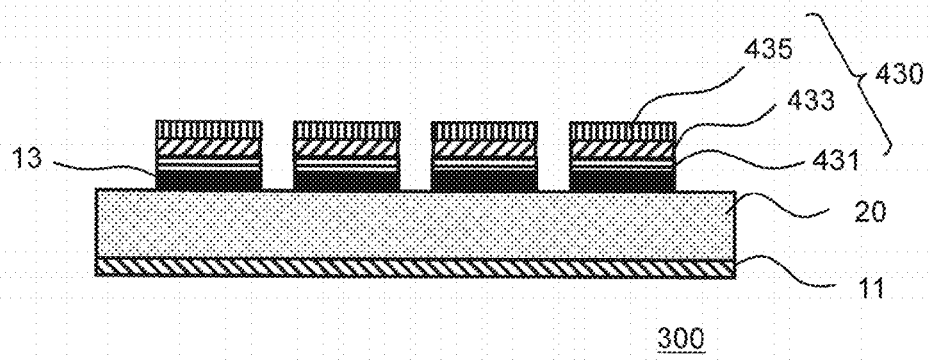
FIG. 13C schematically shows a manufacturing process for the radiation detector 4000 according to an embodiment of the present invention.

In this embodiment, the Pd layer 433 is further formed on each Ni layer 431 formed by sputtering (FIG. 13A). In addition, the Au layer 435 is formed on the Pd layer 433 by sputtering (FIG. 13B). The Ni layer 431, the Pd layer 433, and the Au layer 435 are also formed on each resist remaining portion 12. The substrate 20 is immersed in a solvent such as acetone and ultrasonically cleaned to peel off the remaining resist 12 and lift off the Ni layer 431, the Pd layer 433, and the Au layer 435 on the resist 12. The substrate 20 is cleaned with pure water. The substrate 20 then dried by, for example, spraying nitrogen gas against the substrate 20, thus obtaining a radiation detector UBM electrode structure body 400 in which each electrode layer 13 is provided with the UBM layer 430 constituted by the Ni layer 431, the Pd layer 433, and the Au layer 435 (FIG. 13C).

Subsequently, the radiation detector UBM electrode structure body 400 is diced as needed. This forms a radiation detection element cut into a predetermined shape. Note that a known method can be used for dicing, and hence a detailed description of it will be omitted. The electrode layers 13 on which the UBM layers 430 of the radiation detector UBM electrode structure body 400 constituting a radiation detection element are disposed are connected to electrode layers 560 of an integrated circuit substrate 550 constituting a detection circuit via the bumps 570 (FIG. 14). This makes it possible to manufacture the radiation detector 4000 according to this embodiment.

The radiation detector according to this embodiment can improve the adhesion of the UBM layer 430 with respect to each electrode layer 13 by forming the Ni layer 431 on the electrolessly plated electrode layer 13 by sputtering and sequentially forming the Pd layer 433 and the Au layer 435 on the Ni layer 431 by sputtering. In addition, it is possible to suppress the thermal diffusion of Ni into the surface of the Au layer 435 and the formation of a nickel oxide on the surface of the Au layer 435 and improve solder wettability. Therefore, this embodiment can implement a radiation detector UBM electrode structure body and a radiation detector which achieve sufficient electric characteristics. Although the embodiment has exemplified the case in which the Pd layers 433 are formed by sputtering, they can also be formed by electroless plating.

Fourth Embodiment

Figure 15:
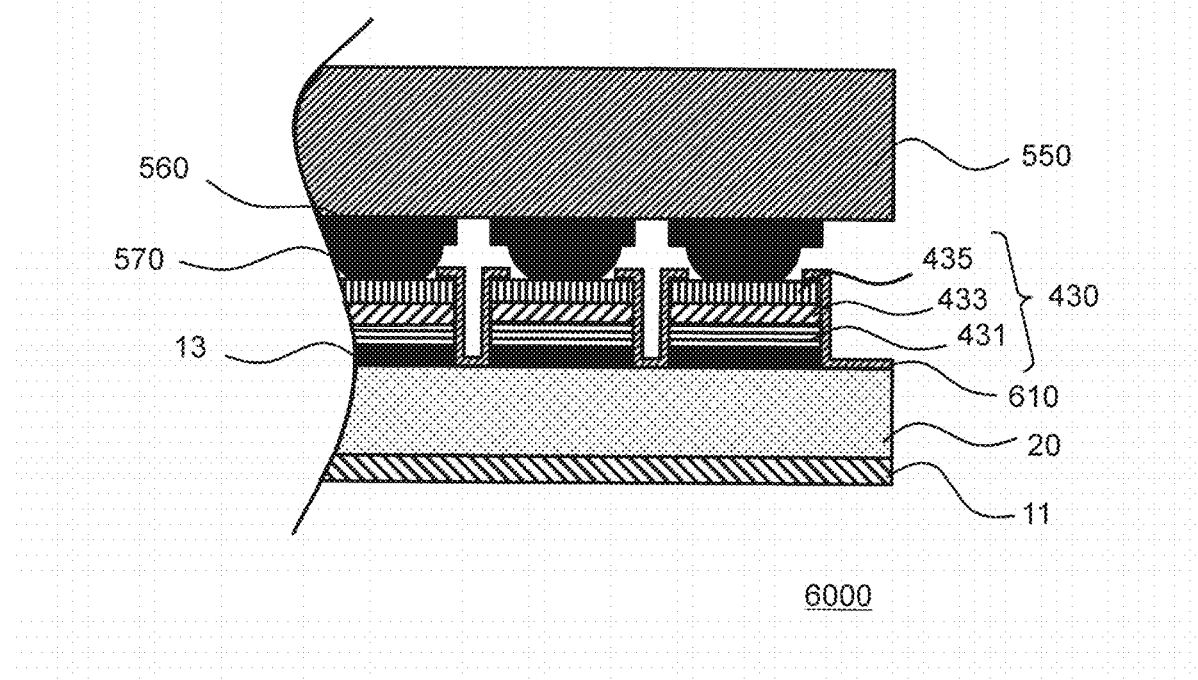
FIG. 15 is a schematic view showing a radiation detector 6000 according to an embodiment of the present invention.

The fourth embodiment will exemplify a case in which electrode layers 13 on which UBM layers are arranged are isolated from each other by an insulating film. FIG. 15 is a schematic view showing a radiation detector 6000 according to an embodiment of the present invention. FIG. 15 corresponds to an enlarged view of a portion in FIG. 2. Referring to FIG. 15, the radiation detector 6000 has bumps 570 connected to the electrode layers 13 via, for example, UBM layers 430.

In an embodiment, the radiation detector 6000 includes a substrate 20, a metal electrode 11 disposed on the first surface of the substrate 20 (the lower surface of the substrate 20 in FIG. 15), and the electrode layers 13 disposed on the second surface of the substrate 20 (the upper surface of the substrate 20 in FIG. 15) which faces the first surface. The radiation detector 6000 also has the UBM layers 430 disposed on the electrode layers 13. The metal electrode 11 is formed on, for example, the entire first surface of the substrate 20. In addition, the electrode layers 13 are disposed on the second surface of the substrate 20 in a matrix pattern. Furthermore, the radiation detector 6000 includes an integrated circuit substrate 550 on which electrode layers 560 are disposed.

In this embodiment, an insulating film 610 is arranged on the side surfaces of the electrode layers 13 and the UBM layers 430, portions of the surfaces of Au layers 435 of the UBM layers 430, and the surface of the second surface of the substrate 20 on which the electrode layers 13 are arranged (more specifically, portions of the second surface of the substrate 20 on which the electrode layers 13 are not arranged). The insulating film 610 can improve adhesion between the electrode layers 13 and the UBM layers 430 and reduce leak currents between the electrode layers 13 on which the adjacent UBM layers 430 are arranged.

The insulating film 610 may be formed from $SiO_2$, which is generally used for an insulating film. However, the present inventors have studied and found that a film formed from $SiO_2$ on the substrate 20 made of CdTe or CdZnTe has weak adhesion and tends to peel off. The insulating film 610 according to this embodiment is preferably formed from polybenzoxazole (PBO) in consideration of adhesion with the substrate 20 made of CdTe or CdZnTe.

In this embodiment, the thickness of the insulating film 610 is preferably 0.1 µm or more and 10 µm or less. If the thickness of the insulating film 610 is smaller than 0.1 µm, leak currents between the electrode layers 13 on which the adjacent UBM layers 430 are arranged undesirably cannot be sufficiently reduced. In contrast, if the thickness of the insulating film 610 is larger than 5 µm, the adhesion between the insulating film and the electrodes/substrate decreases, and the film tends to peel off.

(Method of Manufacturing Radiation Detector)

A method of manufacturing the radiation detector 6000 according to the embodiment will be described. In the method of manufacturing the radiation detector 6000, a process up to the formation of a radiation detector UBM electrode structure body 400 is the same as that in the third embodiment, and hence a detailed description will be omitted.

Figure 16A:
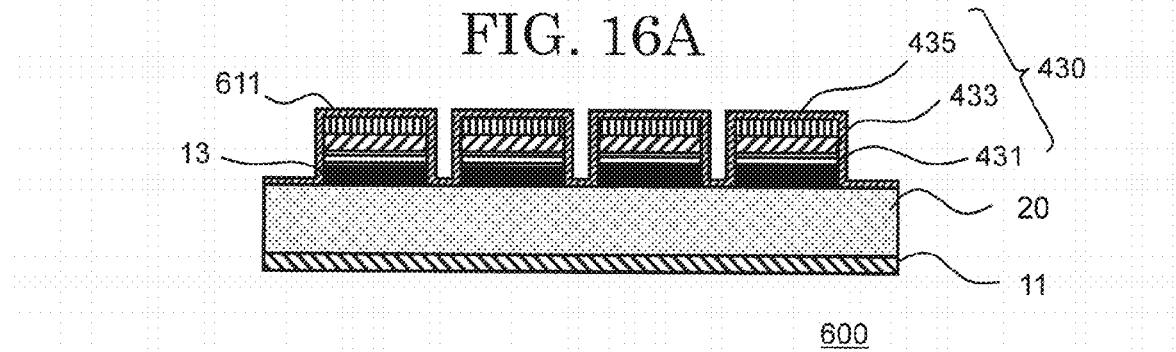
FIG. 16A schematically shows a manufacturing process for the radiation detector 6000 according to an embodiment of the present invention.
Figure 16B:
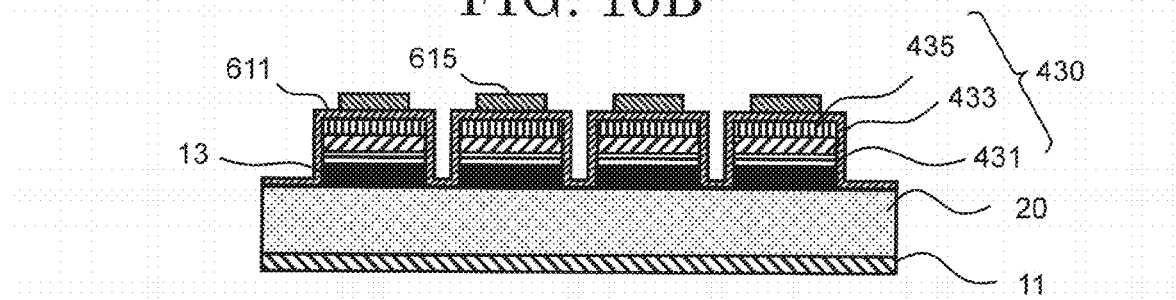
FIG. 16B schematically shows a manufacturing process for the radiation detector 6000 according to an embodiment of the present invention.
Figure 16C:
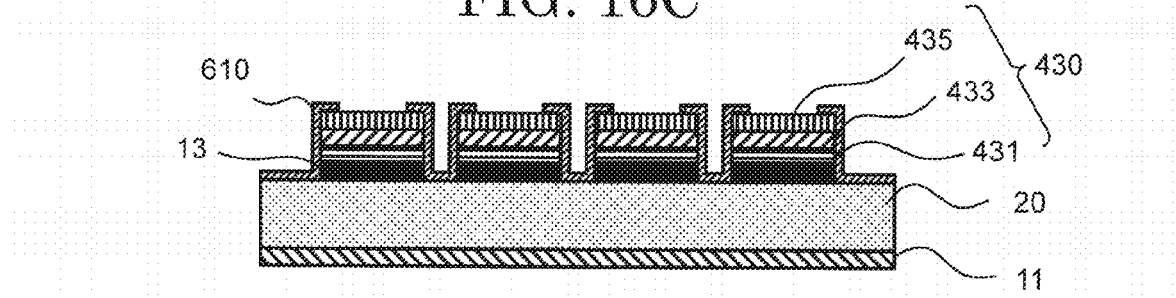
FIG. 16C schematically shows a manufacturing process for the radiation detector 6000 according to an embodiment of the present invention.

FIG. 16A to FIG. 16D schematically shows a manufacturing process for the radiation detector 6000 according to an embodiment of the present invention. The surface of the radiation detector UBM electrode structure body 400 on which the electrode layers 13 and the UBM layers 430 are arranged is coated with polybenzoxazole (PBO) to form a PBO layer 611 (FIG. 16A). A resist pattern 615 is formed on the resultant structure to form openings for the arrangement of the bumps 570 in the UBM layers 430 (FIG. 16B). The PBO layer 611 is cured by irradiation with ultraviolet light to form the insulating film 610. Portions of the uncured PBO layer 611 on which the resist pattern 615 is arranged are removed by developing and washing with water to form the insulating film 610 having openings (FIG. 16C).

Figure 16D:
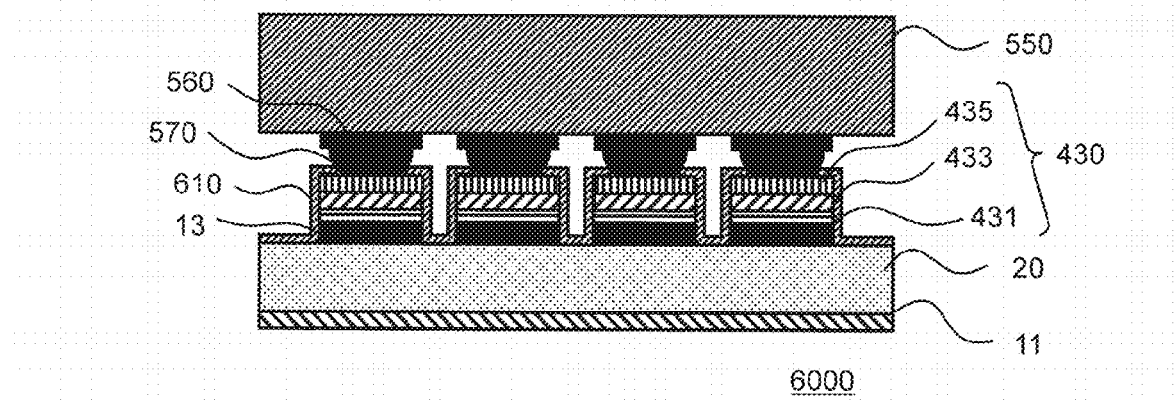
FIG. 16D schematically shows a manufacturing process for the radiation detector 6000 according to an embodiment of the present invention.

Subsequently, the radiation detector UBM electrode structure body 400 on which the insulating film 610 is formed is diced as needed. This forms a radiation detection element cut into a predetermined shape. Note that a known method can be used for dicing, and hence a detailed description of it will be omitted. The electrode layers 13 on which the UBM layers 430 of the radiation detector UBM electrode structure body 400 constituting a radiation detection element are disposed are connected to electrode layers 560 of an integrated circuit substrate 550 constituting a detection circuit via the bumps 570 (FIG. 16D). This makes it possible to manufacture the radiation detector 6000 according to this embodiment.

The radiation detector according to this embodiment can improve the adhesion between the electrode layers 13 and the UBM layers 430 and reduce leak currents between the electrode layers 13, on which the adjacent UBM layers 430 are arranged, by arranging the insulating film 610 on the side surfaces of the electrode layers 13 and the UBM layers 430, portions of the surfaces of the Au layers 435 of the UBM layers 430, and portions of the second surface of the substrate 20 on which the electrode layers 13 are not arranged. In particular, the radiation detector according to this embodiment can prevent the degradation of solder wettability due to diffusion of Ni in Ni layers 431 into the Au layers 435 during the application of heat at the time of formation of the insulating film 610 by having the UBM layers 430 with Pd layers 433 arranged between the Ni layers 431 and the Au layers 435.

EXAMPLES

In conformity with the above embodiments, a 30 mm×30 mm CdZnTe substrate having undergone a polishing (mirror polishing) process was immersed in a 1 vol % bromine methanol solution to remove affected layers formed by the polishing process, thereby etching the substrate surface by 20 μm.

(Formation of Metal Electrodes)

The surface of the substrate was coated with a photoresist. The photoresist was exposed using a photomask on which a pixel electrode pattern was drawn. The exposed photoresist was removed by developing. The substrate was immersed in an etchant prepared by mixing hydrogen bromide, bromine, and water at molar concentration ratios of 1:0.006:6 to etch the polished surface of the substrate at room temperature, thereby removing the affected layers from the surface of the substrate. The etchant was removed from the substrate by using methanol, which in turn was removed from the substrate by using pure water.

Examples 1 to 3

A CdZnTe substrate (111) was prepared. The surface of the CdZnTe substrate 20 was coated with a photoresist, and the 3 μm thick resist pattern 12 as an electrode pattern was formed on the surface by a photolithography method. The CdZnTe substrate 20 covered with the photoresist film was etched by using an etchant prepared by mixing hydrogen bromide, bromine, and water at molar concentration ratios of 1:0.006:6. Impurities on exposed portions of the resist pattern formation surface of the substrate 20, affected layers generated in a cutting process for the substrate 20, and the like were removed.

The substrate was immersed in a bath of a heated solution of hexachloroplatinic (IV) acid hexahydrate solution and hydrochloric acid to form a platinum (Pt) layer to a thickness of 50 nm by electroless plating. A platinum electrode pattern was formed without forming any platinum layer on any resist remaining portions 12.

The substrate 20 on which the platinum electrode layers 13 were formed was mounted on a sputtering apparatus. Under an Ar gas pressure of 0.2 Pa, plasma was generated to sputter a Ni target to form the Ni layers 231 respectively having thicknesses of 0.2 μm, 0.4 μm, and 0.6 μm.

The target was then changed to an Au target to form a 50 nm thick Au layer 233 on each Ni layer 231. The Ni layer 231 and the Au layer 233 were also formed on the resist remaining portion 12. For this reason, the substrate 20 was immersed in acetone and ultrasonically cleaned to peel off each remaining resist 12, thereby lifting off the Ni layer 231 and the Au layer 233 on each resist 12. With the above process, the UBM layer 230 according to Example 1 was formed on each platinum electrode layer 13. Examples 1 to 3, a pattern electrode having a film structure including a 50 nm thick platinum layer, an X μm (X=0.2, 0.4, or 0.6 μm) thick nickel layer, and a 50 nm thick gold layer was formed.

Comparative Example 1

In Comparative Example 1, pattern electrodes were formed in the same manner as in Examples 1 to 3 except that each Ni layer 231 was formed to a thickness of 1.0 μm.

(Evaluation of Adhesion)

The adhesion of the UBM layers 230 formed in Examples 1 to 3 and Comparative Example 1 was evaluated by "Tape Test Method" in "Methods of Adhesion Test for Metallic Coatings" conforming to JIS H8504. In order to conduct tape tests on formed pattern electrode surfaces, a cellophane tape (Nichiban No. 405, adhesive strength: 3.98 N/cm) was pasted on each electrode 13 and peeled off to check whether the electrode 13 was not peeled off from the substrate while adhering to the cellophane tape. Table 1 shows adhesion evaluation results. The results indicate that the electrode adhered to the tape and peeled off from the substrate with nickel X=1.0 μm, but the electrode remained on the substrate and did not adhere to the tape with X≤0.6.

TABLE 1

| | Electrode Layer | Electrode Layer (μm) | Sputtered Ni Layer (μm) | Sputtered Au Film Thickness (μm) | Adhesion | Resistivity (μΩcm) |
|---|---|---|---|---|---|---|
| Example 1 | Pt | 0.05 | 0.2 | 0.05 | ○ | 7 |
| Example 2 | Pt | 0.05 | 0.4 | 0.05 | ○ | 7 |
| Example 3 | Pt | 0.05 | 0.6 | 0.05 | ○ | 7 |
| Comparative Example 1 | Pt | 0.05 | 1.0 | 0.05 | x | 7 |

Examples 4 to 13

A CdZnTe substrate (111) was prepared. The surface of the CdZnTe substrate 20 was coated with a photoresist, and the resist pattern 12 as an electrode pattern was formed on the surface by a photolithography method. The CdZnTe substrate 20 covered with the photoresist film was etched by using an etchant prepared by mixing hydrogen bromide, bromine, and water at molar concentration ratios of 1:0.006:6. Impurities on exposed portions of the resist pattern formation surface of the substrate 20, affected layers generated in a cutting process for the substrate 20, and the like were removed.

The substrate was immersed in an aqueous solution containing 0.8 g/L of chloroplatinic acid (IV) hexahydrate and 20 ml/L of 35 vol % hydrochloric acid at a temperature of 50° C. for 10 min or 20 min to perform electroless plating, thus forming a platinum (Pt) electrodes each having a thickness of 0.05 μm or 0.1 μm.

In addition, the substrate was immersed in an aqueous solution containing 7.5 g/L of Hydrogen Tetrachloroaurate (III) Tetrahydrate and 0.6 g/L of sodium hydroxide at a temperature of 30° C. for 1 min or 2 min to perform electroless plating, thus forming Au electrodes each having a thickness of 0.05 μm or 0.1 μm.

The substrate 20 on which the platinum or gold electrode layers 13 were formed was mounted on a sputtering apparatus. Under an Ar gas pressure of 0.2 Pa, plasma was generated to sputter a Ni target to form the Ni layers 331 each having a thickness of 0.05 μm or 0.10 μm.

The substrate 20 on which the Ni layers 331 were formed was immersed in an electroless Ni plating solution to form a Ni layer 333 having a thickness of 0.2 μm to 1.0 μm on each Ni layer 331 formed by sputtering. Subsequently, the substrate 20 on which the Ni layers 333 were formed was immersed in a substituted electroless Au plating solution to form the 0.05 μm thick Au layer 335 on each Ni layer 333. Table 2 shows the thicknesses of the respective layers in Examples 4 to 13.

Comparative Example 2

In Comparative Example 2, the Ni layers 333 and the Au layers 335 were formed without forming any Ni layers 331 by sputtering. In Comparative Example 2, the Pt- and Au-plated electrodes formed on the CdZnTe substrate were corroded at the time of electroless Ni plating, resulting in an increase in resistance and failing to function as electrodes.

Solder wettability in Examples 4 to 13 was evaluated. Solder wettability was evaluated according to JIS Z 3198-3. Table 2 shows evaluation results. Good solder wettability was obtained in any of these examples.

TABLE 2

|  | Electrode Layer | Electrode Layer (μm) | Sputtered Ni Layer (μm) | Electrolessly Plated Ni Layer (μm) | Electrolessly Plated Au Layer (μm) | Resistivity (μ Ω cm) | Solder Wettability |
|---|---|---|---|---|---|---|---|
| Example 4 | Pt | 0.05 | 0.05 | 0.20 | 0.05 | 37 | ○ |
| Example 5 | Au | 0.10 | 0.10 | 0.20 | 0.05 | 29 | ○ |
| Example 6 | Pt | 0.10 | 0.05 | 0.40 | 0.05 | 42 | ○ |
| Example 7 | Au | 0.05 | 0.10 | 0.40 | 0.05 | 41 | ○ |
| Example 8 | Pt | 0.05 | 0.05 | 0.60 | 0.05 | 49 | ○ |
| Example 9 | Au | 0.10 | 0.05 | 0.60 | 0.05 | 46 | ○ |
| Example 10 | Pt | 0.10 | 0.10 | 0.80 | 0.05 | 47 | ○ |
| Example 11 | Au | 0.05 | 0.05 | 0.80 | 0.05 | 51 | ○ |
| Example 12 | Pt | 0.05 | 0.10 | 1.00 | 0.05 | 51 | ○ |
| Example 13 | Au | 0.10 | 0.05 | 1.00 | 0.05 | 51 | ○ |

In each of Examples 4 to 13, electric characteristics were evaluated by calculating the resistivities of the respective electrodes assuming that a Pt film had 9.8 μΩcm and an Au film had 2.1 μΩcm. Table 2 shows resistivities in the respective examples. As described above, the resistivity of the UBM layer without the Ni layer 331 formed by sputtering in Comparative Example 2 was large, and did not function as an electrode. In contrast to this, Examples 4 to 13 achieved low resistivities of 60 μΩcm or less.

Example 14

In Example 14, the UBM layers 430 were formed, each having the Pd layer 433 arranged between the Ni layer 431 and the Au layer 435. A CdZnTe substrate (111) was prepared. The surface of the CdZnTe substrate 20 was coated with a photoresist, and a resist pattern as an electrode pattern was formed on the surface by a photolithography method. The CdZnTe substrate 20 covered with the photoresist film was etched by using an etchant prepared by mixing hydrogen bromide, bromine, and water at molar concentration ratios of 1:0.006:6. Impurities on exposed portions of the resist pattern formation surface of the CdZnTe substrate 20, affected layers generated in a cutting process for the CdZnTe substrate 20, and the like were removed.

The substrate was immersed in an aqueous solution containing 0.8 g/L of chloroplatinic acid (IV) hexahydrate and 20 ml/L of 35 vol % hydrochloric acid at a temperature of 50° C. for 10 min to perform electroless plating, thus forming a Pt electrode having a thickness of 0.05 μm.

The substrate on which the Pt electrode layers 13 were formed was mounted on a sputtering apparatus. Under an Ar gas pressure of 0.2 Pa, plasma was generated to sputter a Ni target to form the Ni layers 431 each having a thickness of 0.5 μm. The target was sequentially changed to a Pd target and finally changed to an Au target to sequentially form the 50 nm thick Pd layer 433 and the 50 nm thick Au layer 435 on each Ni layer 431. The resultant structure was immersed in acetone and ultrasonically cleaned to peel off remaining resists, thereby performing liftoff. With the above process, the UBM layer 430 was formed on each Pt electrode layer 13. In Example 14, the diffusion of Ni in the Ni layer 431 into the Au layer 435 and the formation of a Ni oxide film in the uppermost surface layer of the Au layer 435 can be suppressed by arranging the Pd layer 433 between the Ni layer 431 and the Au layer 435. This made it possible to suppress the degradation of solder wettability.

Example 15

Figure 17A:
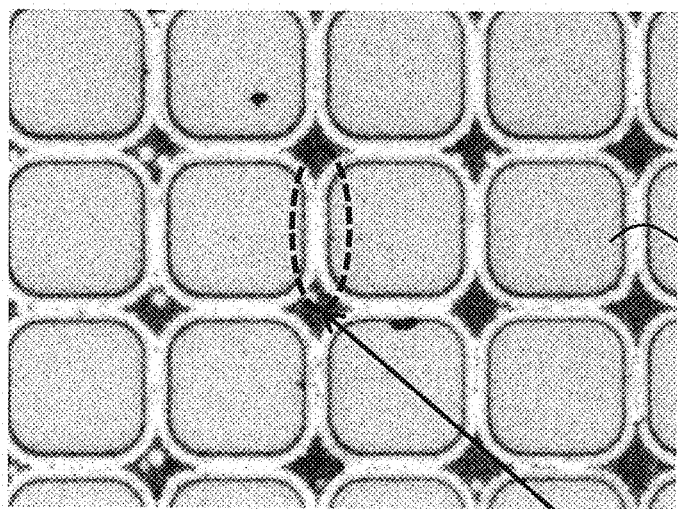
FIG. 17A shows optical microscopic images of the radiation detector 6000 according to an example of the present invention.

In Example 15, the insulating film 610 was formed between the electrode layers 13. This made it possible to suppress the degradation of detected signals due to current leakage through between the electrodes and to also prevent changes in characteristics of the substrate itself due to contact between moisture and the like and the substrate surface exposed between the electrodes. At first, a method was tried, in which a SiO$_2$ film was formed as an insulating film by a chemical vapor deposition method, and electrode portions were selectively etched with hydrofluoric acid. In this method, however, it was necessary to heat the substrate 20 to 300° C. to 400° C., and a peeling 619 of the SiO$_2$ film was generated near the electrode layer 13 by the thermal expansion difference between the SiO$_2$ film and the CdZnTe substrate 20 (FIG. 17A).

Figure 17B:
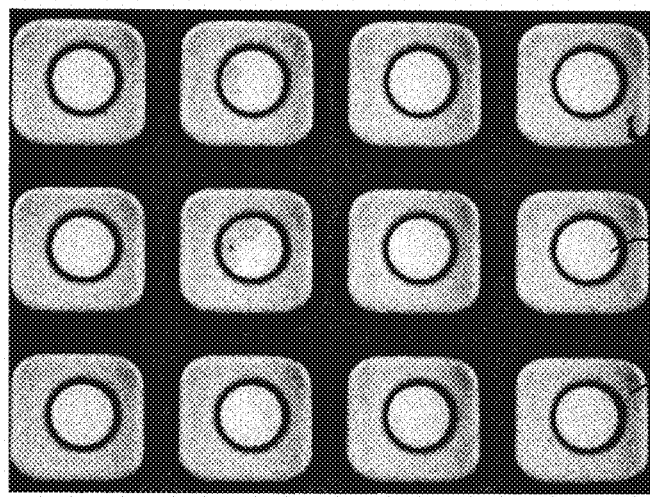
FIG. 17B shows optical microscopic images of the radiation detector 6000 according to an example of the present invention.

In order to form the insulating film 610 at a lower temperature, the insulating film 610 was formed by using polybenzoxazole (PBO) (product name: CRC-8300S available from Sumitomo Bakelite Co., Ltd) as an organic permanent resist film. The CdZnTe substrate 20 with the UBM electrode layers was coated with CRC-8300S and was prebaked at 120° C. for 5 min. The resultant structure was irradiated with ultraviolet light from a mercury lamp at 510 mJ/cm$^2$ through a pattern mask, thus forming circular windows on the electrodes. Thereafter, a developing process was performed to dissolve the window portions of the PBO film. The resultant structure was washed with water. Finally, the resultant structure was heated in a high-purity nitrogen gas flow at 200° C. for 15 min to form the insulating film 610. In this example, no peeling occurred between the insulating film 610 and the substrate 20 (FIG. 17B). In this example, the degradation of solder wettability caused by the diffusion of Ni in the Ni layer 431 into the Au layer 435 during the application of heat at the time of formation of the insulating film 610 can be suppressed by arranging the Pd layers 433 between the Ni layers 431 and the Au layers 435. This further made it possible to reduce leak currents between the electrode layers 13 on which the adjacent UBM layers 430 were arranged.

The radiation detector UBM electrode structure body and the method of manufacturing the same according to the present invention can implement a radiation detector UBM electrode structure body and a radiation detector which suppress the degradation of a metal electrode layer at the time of formation of a UBM layer and achieve sufficient electric characteristics, and a method of manufacturing the same.

The invention claimed is:

1. A radiation detector UBM electrode structure body including a substrate made of CdTe or CdZnTe, comprising:
    a Pt or Au electrode layer formed on the substrate by electroless plating;
    a Ni layer formed on the Pt or Au electrode layer by sputtering, a thickness of the Ni layer being 0.2 µm or more and 0.6 µm or less; and
    a Pd layer and an Au layer sequentially formed on the Ni layer by sputtering, a thickness of the Pd layer being 0.03 µm or more and 0.1 µm or less.

2. The radiation detector UBM electrode structure body according to claim 1, further comprising an insulating film arranged on side surfaces of the Pt or Au electrode layer and an UBM layer including the Ni layer, the Pd layer, and the Au layer, part of an upper surface of the UBM layer, and a surface of the substrate on which the Pt or Au electrode layer is arranged.

3. A radiation detector comprising:
    a radiation detection element including the radiation detector UBM electrode structure body according to claim 1 and a metal electrode layer disposed on the substrate so as to face the Pt or Au electrode layer formed by electroless plating; and
    a detection circuit connected to the Au layer of the radiation detection element via a bump.

4. A method of manufacturing a radiation detector, comprising:
    forming a radiation detection element by cutting the radiation detector UBM electrode structure body according to claim 1; and
    connecting a detection circuit to the Au layer of the radiation detection element via a bump.

5. A method of manufacturing a radiation detector UBM electrode structure body, comprising:
    preparing a substrate made of CdTe or CdZnTe;
    forming a metal electrode on a first surface of the substrate and forming a Pt or Au electrode layer on a second surface of the substrate by electroless plating so as to face the metal electrode;
    forming a Ni layer having a thickness of 0.2 µm or more and 0.6 µm or less on the Pt or Au electrode layer by sputtering;
    forming a Pd layer having a thickness of 0.03 µm or more and 0.1 µm or less on the Ni layer by sputtering; and
    forming an Au layer on the Pd layer by sputtering.

6. The method of manufacturing the radiation detector UBM electrode structure body according to claim 5, further comprising forming an insulating film arranged on side surfaces of the Pt or Au electrode layer and a UBM layer including the Ni layer, the Pd layer, and the Au layer, part of an upper surface of the UBM layer, and a surface of the substrate on which the Pt or Au electrode layer is arranged.

* * * * *